United States Patent [19]
Fura

[11] Patent Number: 5,953,519
[45] Date of Patent: Sep. 14, 1999

[54] METHOD AND SYSTEM FOR GENERATING ELECTRONIC HARDWARE SIMULATION MODELS

[76] Inventor: David A. Fura, 6815 21st Ave NE, Seattle, Wash. 98115

[21] Appl. No.: 08/662,370

[22] Filed: Jun. 12, 1996

Related U.S. Application Data

[60] Provisional application No. 60/000,162, Jun. 12, 1995.
[51] Int. Cl.$^6$ ..................................................... G06F 17/00
[52] U.S. Cl. .................................. 395/500.19; 795/500.05
[58] Field of Search .................................... 364/488–491, 364/578; 395/500

[56] References Cited

U.S. PATENT DOCUMENTS

| | | | |
|---|---|---|---|
| 5,097,422 | 3/1992 | Corbin, II et al. | 364/491 |
| 5,258,932 | 11/1993 | Matsuzaki | 364/578 |
| 5,390,320 | 2/1995 | Smithline | 395/500 |
| 5,392,227 | 2/1995 | Hiserote | 364/578 |
| 5,572,437 | 11/1996 | Rostoker et al. | 364/489 |

OTHER PUBLICATIONS

Manivannan et al "Real–Time Control of a Manufacturing Cell Using Knowledge–Based Simulation," IEEE, pp. 251–260, Dec. 1991.

Wang et al "Time Windows: An Approach to Automated Abstraction of Continuous–Time Modls into Discrete–Event Models," IEEE, pp. 204–211, Mar. 1990.

*Primary Examiner*—Eric W. Stamber
*Assistant Examiner*—Vuthe Siek
*Attorney, Agent, or Firm*—Robert M. Storwick

[57] ABSTRACT

A method and system for generating electronic hardware simulation model segments is disclosed. The input to the method and system are abstraction models that define the mappings between the signals of electronic circuit models and the signals of specification models expressed at higher levels of temporal and/or data abstraction. Abstraction models are converted into simulation model segments using a two-step process where abstraction models are first converted into intermediate data structures. A second step converts the data structures into simulation model segments in any of the standard hardware description languages (HDLs). Useful applications of the method and system include automated simulation test bench generation and automated synthesis of hardware design models from behavioral specifications.

20 Claims, 28 Drawing Sheets

Block Diagram of the Invention Internal Blocks and Interfaces.

The Role of Abstraction Modeling in Relating Implementation Signals to Specification Signals.

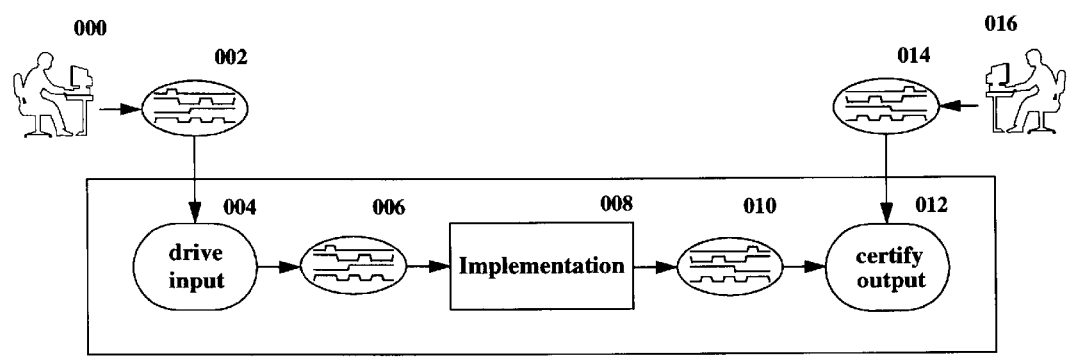
Fig. 0: Block Diagram of Test Benches Generated by Prior Art Tools.

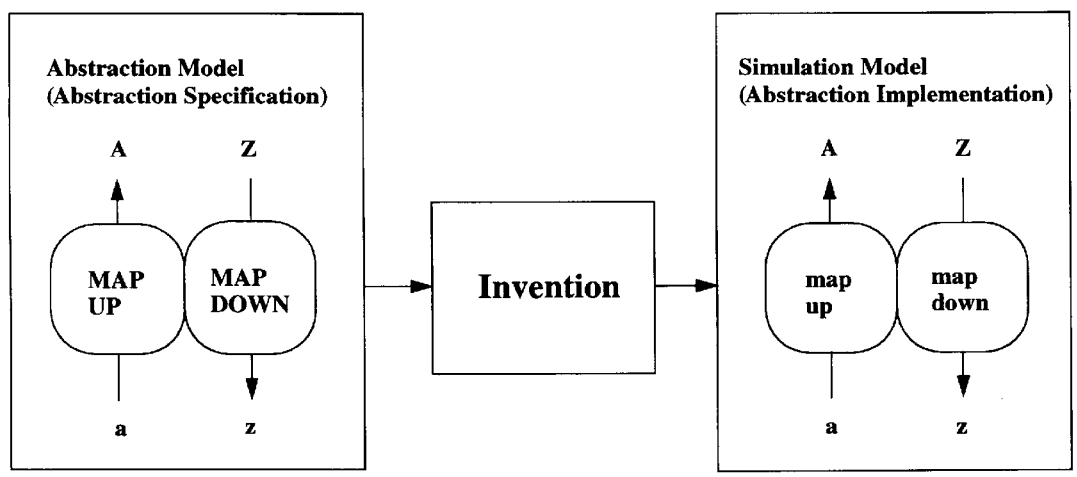
Fig. 1: Block Diagram of the Invention in its Most General Form.

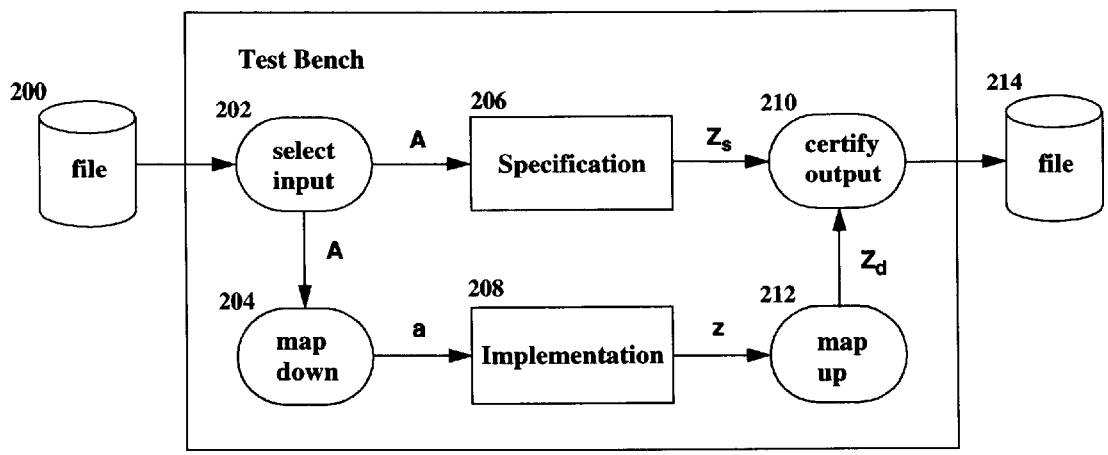
Fig. 2: Block Diagram of Self-Testing Test Benches Generated by the Invention.

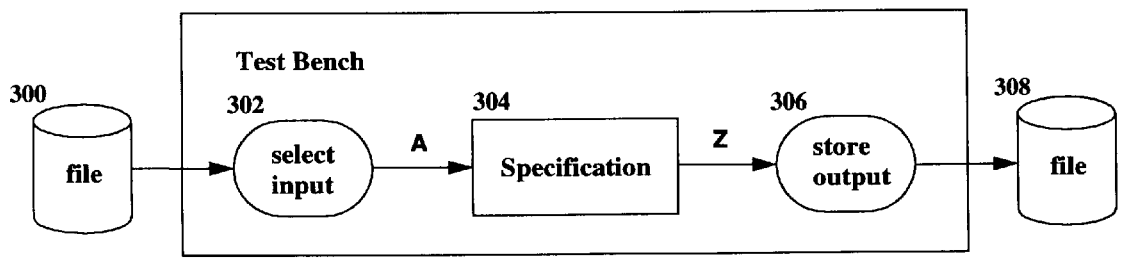
Fig. 3: Block Diagram of Specification Test Benches Generated by the Invention.

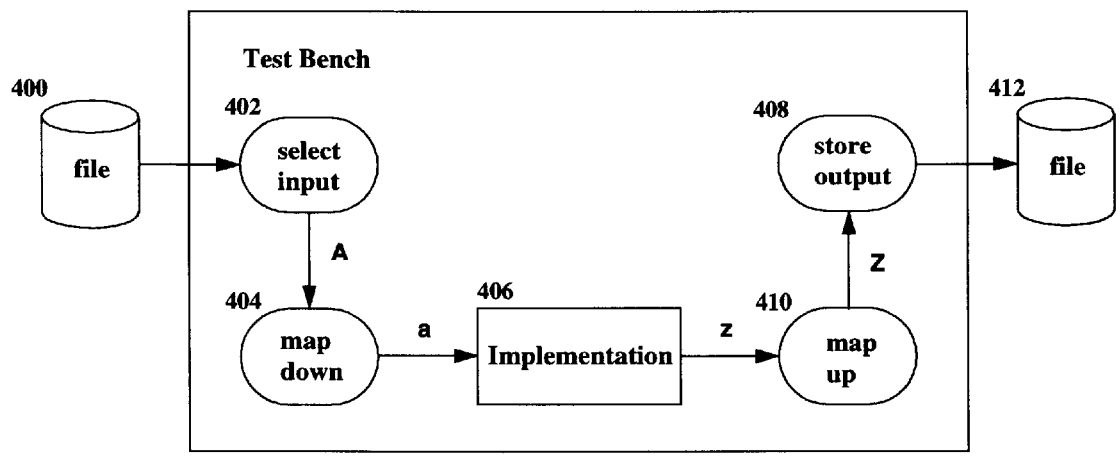
Fig. 4: Block Diagram of Implementation Test Benches Generated by the Invention.

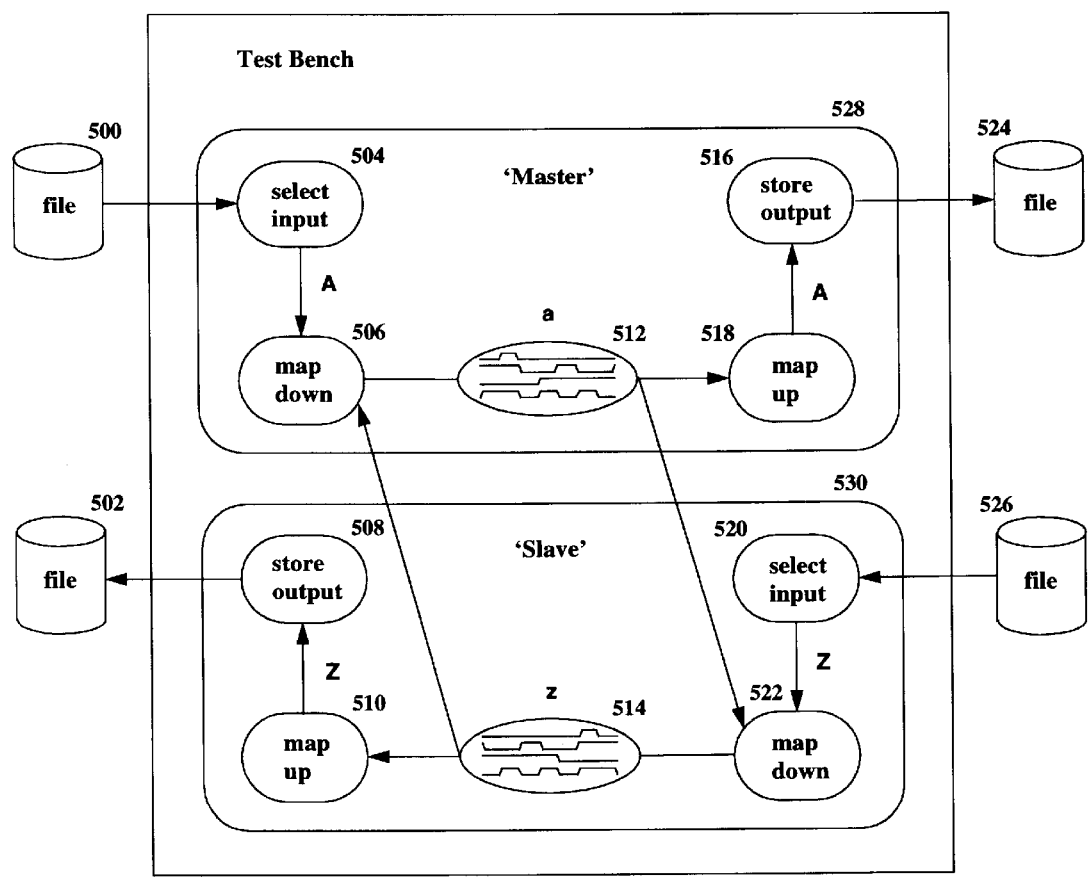
Fig. 5: Block Diagram of Protocol Test Benches Generated by the Invention.

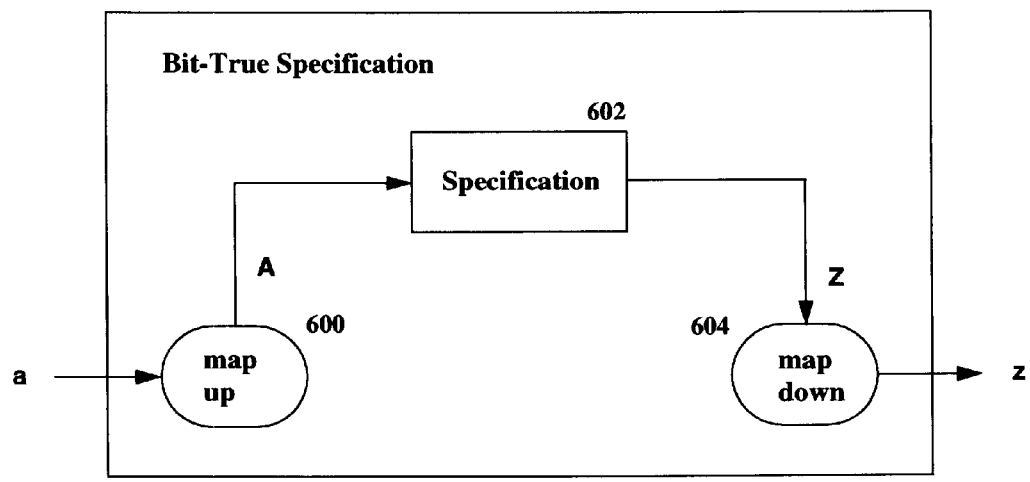
Fig. 6: Block Diagram of Bit-True Specifications Generated by the Invention.

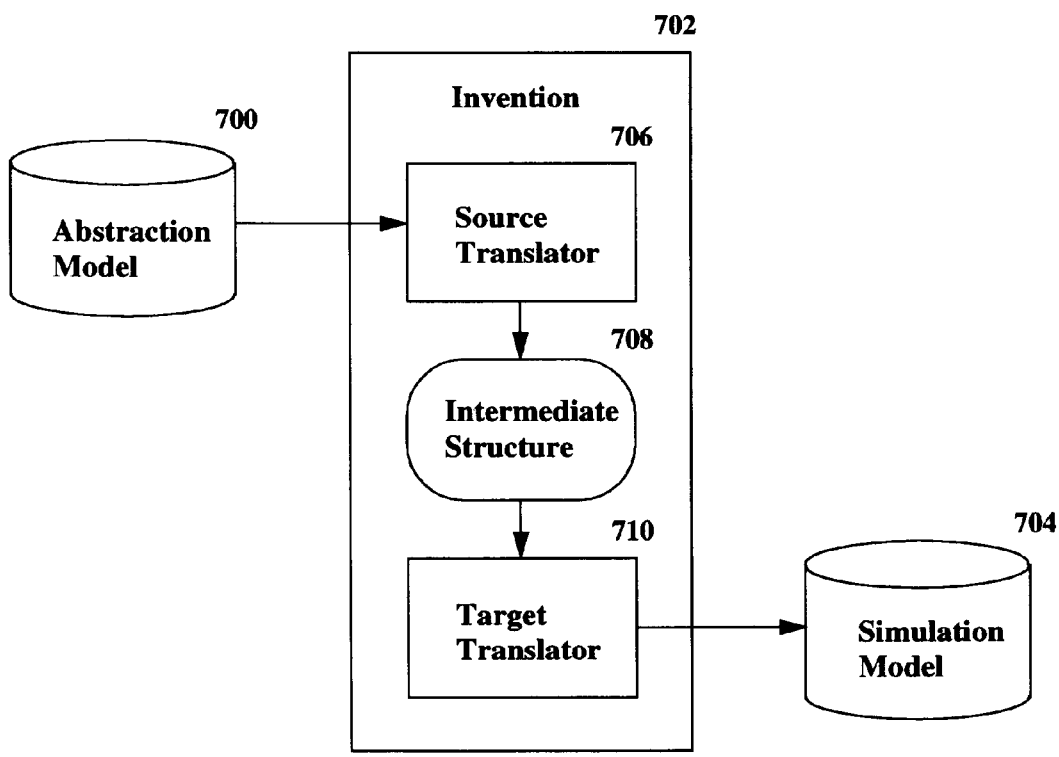
Fig. 7: Block Diagram of the Invention Internal Blocks and Interfaces.

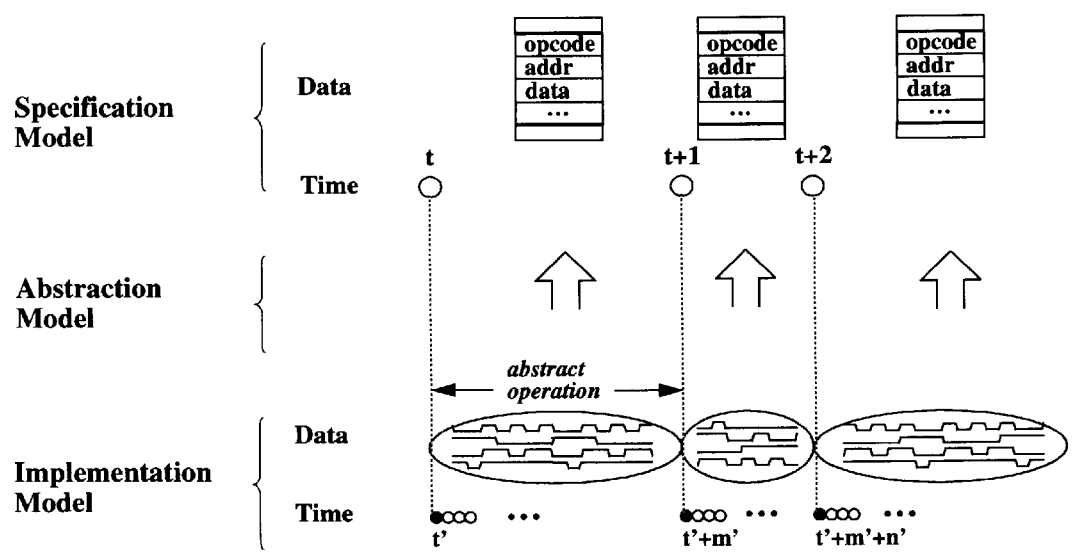
Fig. 8: The Role of Abstraction Modeling in Relating Implementation Signals to Specification Signals.

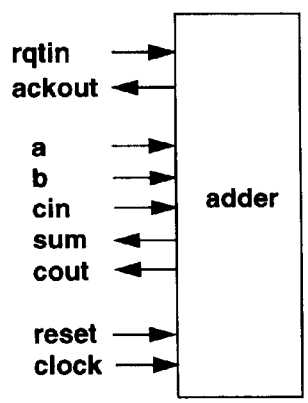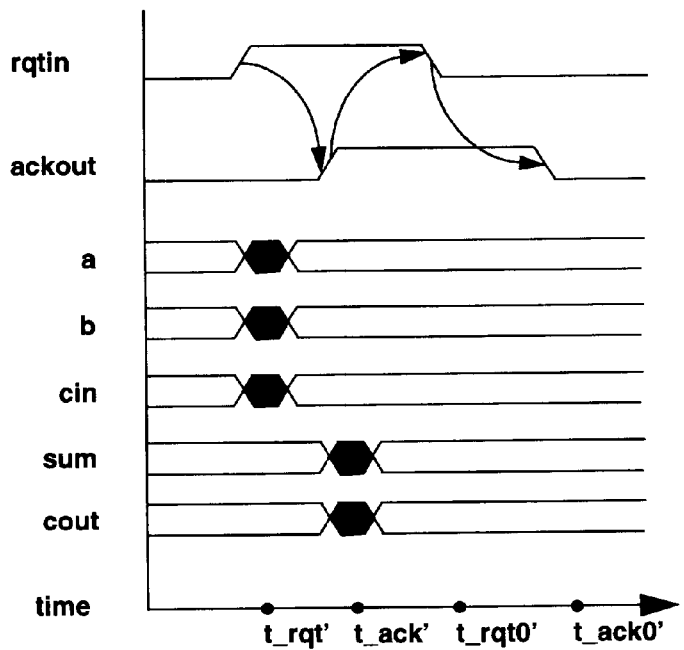
(a) Signal Directionality.　　(b) Signal Relationships.
Fig. 9: Informal Description of a Single-Bit Full-Adder with Four-Phase Interface Protocol.

```
1   spec_entity add2s is
2     subtype int1 is integer range 0 to 1;
3     subtype int2 is integer range 0 to 3;
4   port (
5     A, B, CIN :in int1;
6     COUT_SUM :out int2;
7     ... );
8   end add2s;
9
10  design_entity add2 is
11  port (
12    a, b, cin, rqtin :in std_logic;
13    sum, cout, ackout :out std_logic;
14    ... );
15  end add2;
16
17  architecture trans of rtl is
18    alias t' :time is timewhen rqtin -> '1' for t 'thcountsince 1;
19    alias t_ack' :time is timewhen ackout -> '1' for 0 'thcountsince t';
20    ...
21  begin
22    ( A at t    *=  to_integer (a) at t' )   'and
23    ( B at t    *=  to_integer (b) at t' )   'and
24    ( CIN at t  *=  to_integer (cin) at t' ) 'and
25    ( COUT_SUM at t  *=  to_integer (cout & sum) at t_ack' )  'and
26    ...
27  end;
```

Fig. 10: Example Abstraction Model Segment Showing Sampling-Based Abstraction.

```
1    spec_entity add2s is
2      type OpTy is ( SAT, XXX );
3      port (
4        RST_OP, LIVE_OP :in OpTy;
5        ... );
6    end add2s;
7
8    design_entity add2 is
9      port (
10       reset, rqtin :in std_logic;
11       ... );
12   end add2;
13
14   architecture trans of rtl is
15   begin
16     ( RST_OP at t *=
17       SAT *when ( reset = '1' at 0 *and reset = '0' during [ 1 , ... ] ) *else XXX ) *and
18     ( LIVE_OP at t *=
19       SAT *when ( rqtin -> '1' for t 'thcountsince 1 at t' ) *else XXX ) *and
20     ...
21   end;
```

Fig. 11: Example Abstraction Model Segment Showing Selection-Based Abstraction.

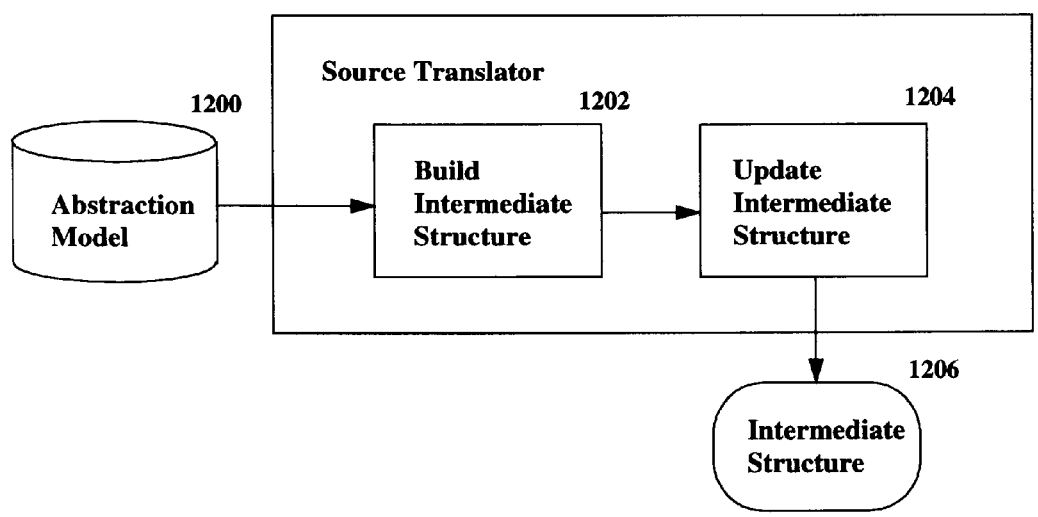
Fig. 12: Major Steps of the Source Translator.

```
typedef struct SigNode {
    char              *name;
    struct TypeNode   *type;
    modeType          mode;
    struct CompNode   *comp;
    struct SigNode    *next;
} *Signal;
```

(a) Signal Node Structure.

```
typedef struct CompNode {
    compType          name;
    struct SigNode    *f1;
    struct SigNode    *f2;
    struct SigNode    *f3;
    struct SigNode    *f4;
    union {
        struct SigNode  *f5;
        int             i5;
    } u5;
    struct CompNode   *next;
} *Component;
```

(b) Component Node Structure.

Fig. 13: Data Structures Used to Represent Signals and Components.

x *= ( f and g ) implies ( not h )
(a) Example Formula to be Translated.
∃ x1 x2.
( x1 *= f and g ) *and
( x2 *= not h ) *and
( x *= x1 implies x2 )
(b) Decomposed Formula.
 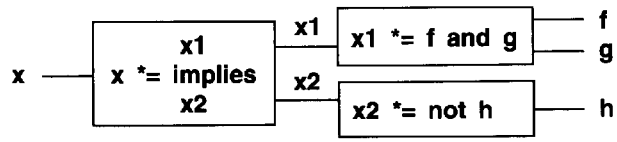
(c) Synthesized Structure.
Fig. 14: Syntax-Directed Translation of Abstraction Model Signals into Implementing Structures.

alias t' :time is timewhen rqtin -> '1' for t 'thcountsince 1;
(a) Example Alias Declaration to be Translated.
x_tprime *= rqtin->'1' for t 'thcountsince 1
(b) Signal-Based Interpretation of Alias Declaration.
∃ x0.
( x0 *= rqtin -> '1' ) *and
( x_tprime *= x0 for t 'thcountsince 1 )
(c) Decomposed Alias Declaration.
Fig. 15: Decomposition Step for Example Aliased Time Declaration.

x8  *=  reset = '1' at 0  *and  reset = '0' during [ 1 , ... ]
(a) Example Abstraction Formula.
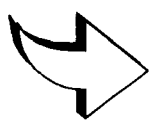
∃ x4, X5, x6, X7
( x4  *=  reset = '1' ) *and
( X5  *=  x4 at 0 ) *and
( x6  *=  reset = '0' ) *and
( X7  *=  x6 during [ 1 , ... ] ) *and
( X8  *=  x5 *and x7 )
(b) Decomposed Abstraction Formula
Fig. 16:  Decomposition Step for Example Reset Formula.

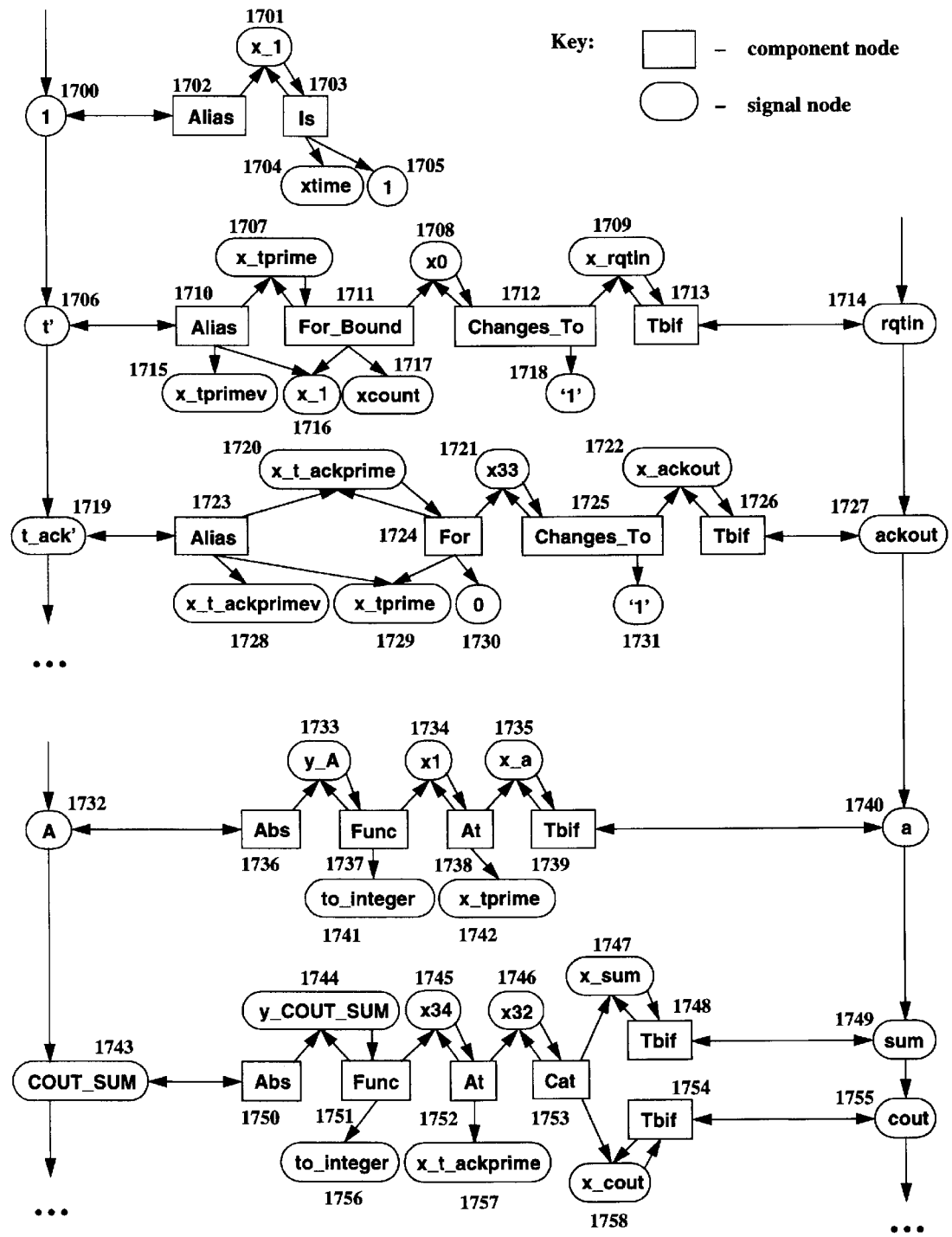
Fig. 17: Portions of the Intermediate Structure for the VIL Model of Fig. 10.

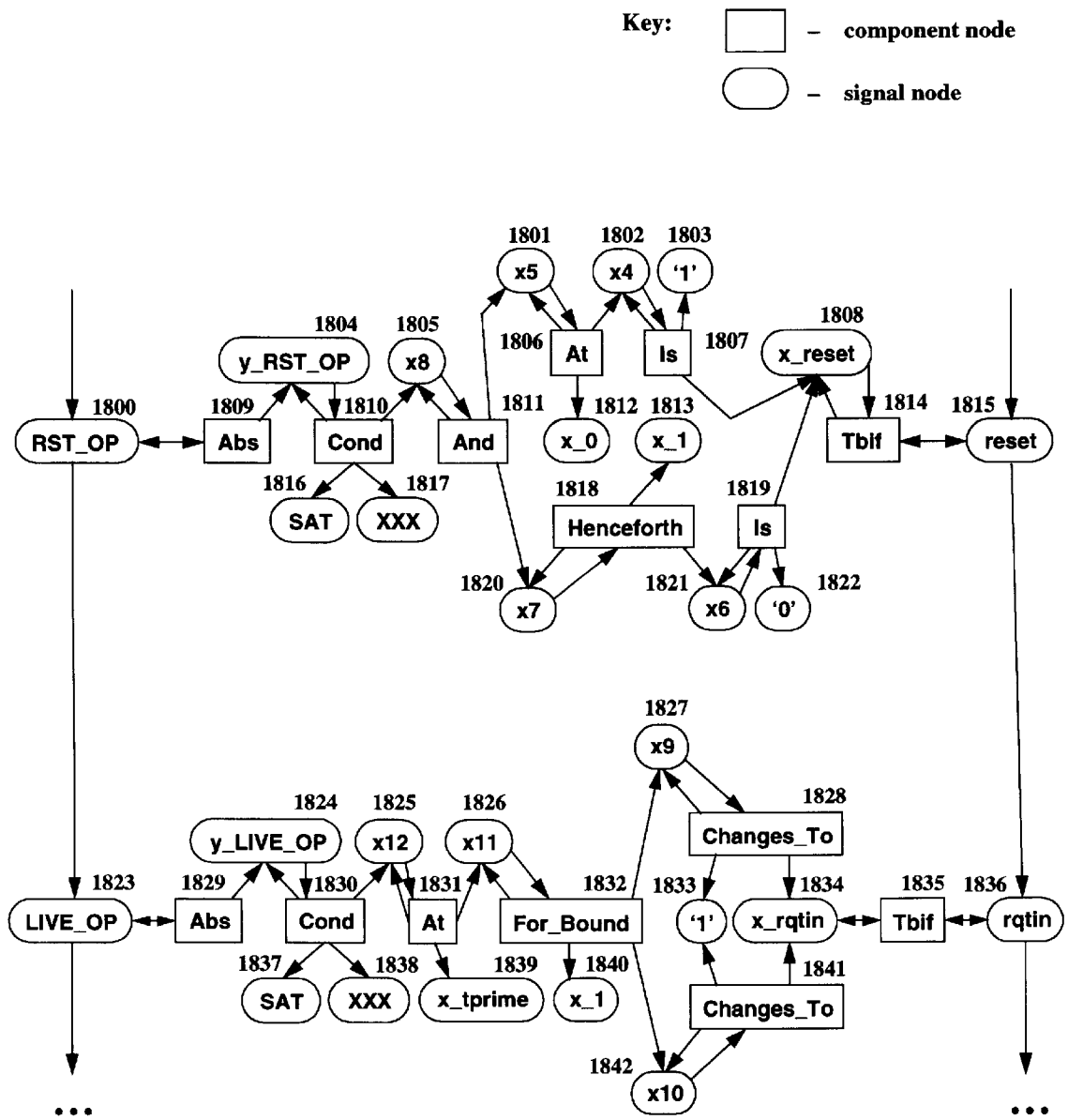
Fig. 18: Portions of the Intermediate Structure for the VIL Model of Fig. 11.

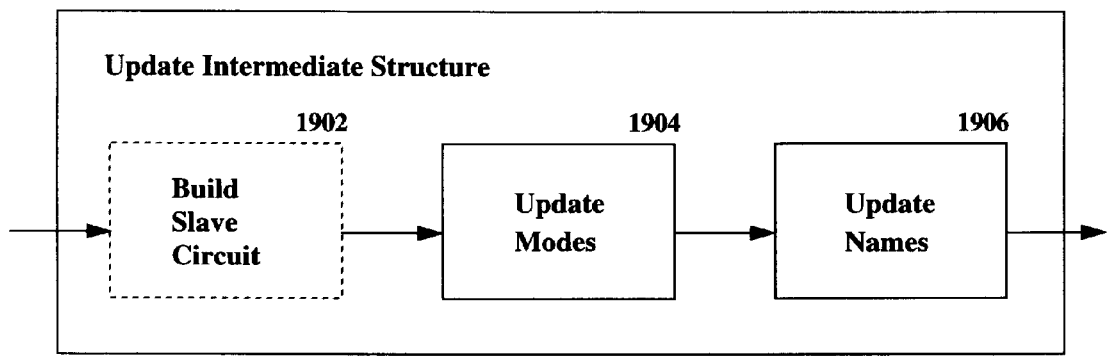
Fig. 19: Major Steps of Updating Intermediate Structures.

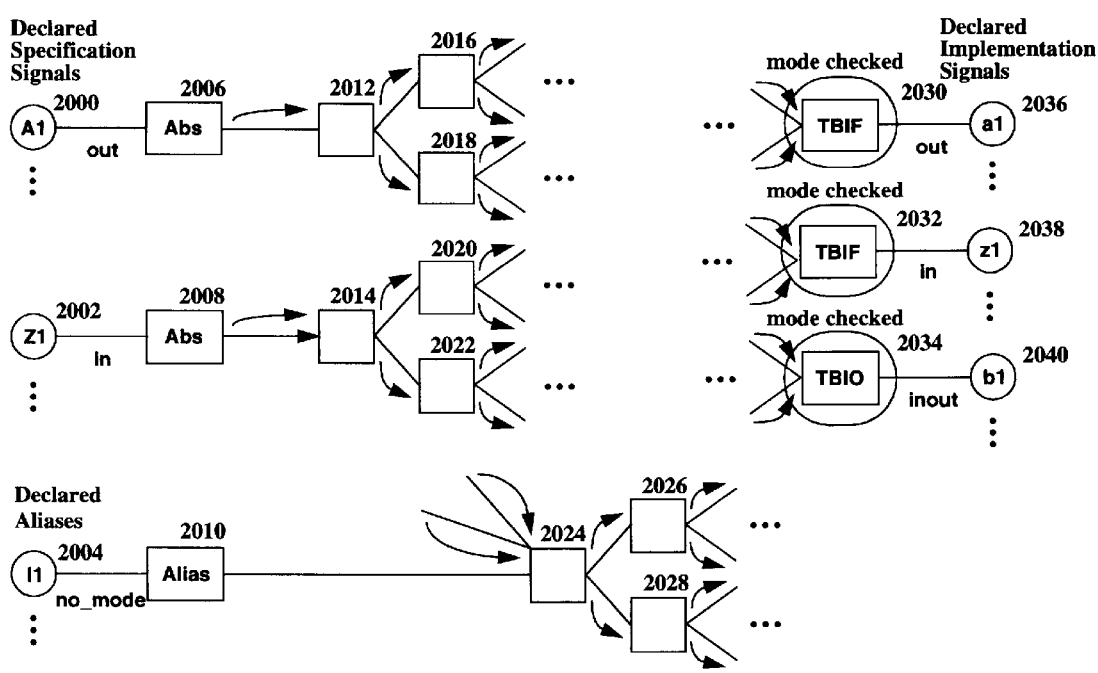
Figure 20: Top-Down Mode Updates Following Initial Assignment.

```
1   -- 1: --
2   x_1 <= xtime = 1;
3   -- t': --
4   x0c:chgto1i port map ( x => x0 , f => x_rqtin , ck => x_clock );
5   x_tprimec:forboundi port map ( x => x_tprime , f => x0 , e => x_1 , ct => xcount , ck => x_clock );
6   -- t_ack': --
7   x_t_ackprimevc:guardi port map ( x => x_t_ackprimev , e => x_t_ackprime , r => x_tprime ,
8                                    ck => x_clock);
9   x33c:chgto1i port map ( x => x33 , f => x_ackout , ck => x_clock );
10  x_t_ackprimec:fori generic map ( n => 0 )
11                     port map ( x => x_t_ackprime , f => x33 , e => x_tprime , ck => x_clock );
12  ...
13  -- A: --
14  x1c:ato port map (x => x1 , f => x_a , e => x_tprime );
15  x1 <= to_tblogic ( y_A );
16  ...
17  -- COUT_SUM: --
18  x32 <= x_cout & x_sum;
19  x34c:atni port map (x => x34 , f => x32 , e => x_t_ackprime , r => x_tprime , ck => x_clock );
20  y_COUT_SUM <= to_integer ( x34 );
21  ...
22  -- RST_OP: --
23  x4c:is1o port map ( x => x4 , f => x_reset );
24  x5c:ato port map (x => x5 , f => x4 , e => x_0 );
25  x6c:is0o port map ( x => x6 , f => x_reset );
26  x7c:henceo port map (x => x7 , f => x6 , e => x_1 , ck => x_clock );
27  x8c:ando port map (x => x8 , f => x5 , g => x7 );
28  x8 <= '1' when ( y_RST_OP = SAT ) else '0';
29  ...
30  -- LIVE_OP: --
31  x9c:chgto1o port map ( x => x9 , f => x_rqtin , ck => x_clock );
32  x10c:chgto1i port map ( x => x10 , f => x_rqtin , ck => x_clock );
33  x11c:forboundo port map ( x => x11 , f => x9 , e => x_1 , fin => x10 , ck => x_clock );
34  x12c:ato port map (x => x12 , f => x11 , e => x_tprime );
35  x12 <= '1' when ( y_LIVE_OP = SAT ) else '0';
36  ...
37  -- Test bench interface signals: --
38  a <= to_stdlogic( x_a );
39  ...
40  rqtin <= to_stdlogic( x_rqtin );
41  ...
42  reset <= to_stdlogic( x_reset );
43  x_sum <= to_tblogic( sum );
44  x_cout <= to_tblogic( cout );
45  ...
46  DUT:add2 port map (a , b , cin , rqtin , clock , reset , sum , cout , ackout );
```

Fig. 21: Portions of a Generated VHDL Simulation Model for the Intermediate Structure of Fig. 17 and Fig. 18.

```
1   -- File I/O for process t --------------------------------
2   proc_t: process( x0 )
3   ...
4   -- Read test mode ---------------
5   if ( x0'event and x0 = '1' and xcount < 0 ) then
6      readline ( infile , lin );
7      read ( lin , cch );
8      if ( cch = 'i' ) then mmode := VECTORS;
9      elsif ( cch = '!' ) then mmode := EXHAUSTIVE;
10     elsif ( cch = '?' ) then mmode := RANDOM;
11     end if;
12  end if;
13  ...
14  -- Record design outputs ----------
15  if ( x0'event and x0 = '1' and xcount >= 0 ) then
16     write ( lout , string'(", "));
17     write ( lout , y_COUT_SUM );   write ( lout , string'(" "));   -- record COUT_SUM
18     write ( lout , OpTy2ch( y_ACK_OP ));   write ( lout , string'(" "));   -- record ACK_OP
19     writeline ( outfile , lout );
20     if ( x_t_ackprimev /= 1 ) then
21        write ( lout , string'("*** Error: missing event for time t_ack' ***"));
22        writeline ( outfile , lout );
23     end if;
24  end if;
25  ...
26  -- Drive design inputs -------------
27  if ( x0'event and x0 = '1' ) then
28     ------------------------
29     if ( mmode = VECTORS ) then
30        readline ( infile , lin );
31        read ( lin , yAi );
32        y_A <= yAi;   -- read & drive A
33        ...
34        read ( lin , sstring ( 1 to 3 ));   read ( lin , cch );
35        y_RST_OP <= ch2OpTy ( sstring ( 1 to 3 ));   -- read & drive RST_OP
36        ...
37     ------------------------
38     elsif ( mmode = EXHAUSTIVE ) then
39        ...
40     ------------------------
41     elsif ( mmode = RANDOM ) then
42        ...
43     end if;
44  end if;
45  end process;
```

Fig. 22: Portions of a Generated VHDL Simulation Model Implementing Input Selection and Output Recording.

```
-- x = f At (TimeWhen e_lb to TimeWhen e_ub) or
-- x = f At (TimeWhen e_ub downto TimeWhen e_lb)
-- (type tb_ulogic, mode in).

library tb;
use tb.tb_logic.all;

entity atyi is
  generic (lb, ub :integer);
  port (f, e, r, ck :in tb_ulogic;
      x :out tb_ulogic_vector(lb to ub));
end atyi;

architecture rtl of atyi is
begin
  process (f, e, r, ck)
    variable e_count, new_e_count :integer := 0;
    variable x_state, new_x_state :tb_ulogic_vector(lb to ub);
  begin
    if (ck'event and ck = '1') then
      e_count := new_e_count;
      x_state := new_x_state;
    elsif (not ck'event) then
      if (e = '0' and r = '0') then new_e_count := e_count;
      elsif (e = '0' and r = '1') then new_e_count := 0;
      elsif (e = '1' and r = '0') then new_e_count := e_count + 1;
      elsif (e = '1' and r = '1') then new_e_count := 1;
      end if;
      if (e = '1' and lb <= new_e_count and new_e_count <= ub) then
        new_x_state(new_e_count) := f;
      elsif (e = '0' and lb <= new_e_count and new_e_count <= ub) then
        new_x_state(new_e_count) := x_state(new_e_count);
      end if;
    end if;
    x <= new_x_state;
  end process;
end rtl;
```

Figure 23: VHDL Component Model Implementing At Construct, Mode In.

```
-- x = f At (TimeWhen e_lb to TimeWhen e_ub) or
-- x = f At (TimeWhen e_ub downto TimeWhen e_lb)
-- (type std_ulogic, mode out)
```

```vhdl
library tb;
use tb.tb_logic.all;

entity atyo is
  generic (lb, ub :integer);
  port (x :in tb_logic_vector; e, r, ck :in tb_logic; f :out tb_ulogic);
end atyo;

architecture rtl of atyo is
begin
  process (x, e, r, ck)
    variable e_count, new_e_count :integer;
  begin
    if (ck'event and ck = '1') then
      e_count := new_e_count;
    elsif (not ck'event) then
      if (r = '0' and e = '0') then new_e_count := e_count;
      elsif (r = '0' and e = '1') then new_e_count := e_count + 1;
      elsif (r = '1' and e = '0') then new_e_count := 0;
      elsif (r = '1' and e = '1') then new_e_count := 1;
      end if;
      if (e = '1' and lb <= new_e_count and new_e_count <= ub) then
        f <= x(new_e_count);
      else
        f <= '-';
      end if;
    end if;
  end process;
end rtl;
```

Figure 24: VHDL Component Model Implementing At Construct, Mode Out.

```
-- x = f for (n to m) 'thcountsince timewhen e (mode in, n numerical
--     constant, m numerical constant, e an ident)
```

```
library tb;
use tb.tb_logic.all;

entity forggi is
  generic (n, m :integer);
  port (f, e, ck :in tb_ulogic; x :out tb_logic_vector);
end forggi;

architecture rtl of forggi is
begin
  process (f, e, ck)
    variable f_count, new_f_count :integer := -1;
    variable x_state, new_x_state :tb_logic_vector(n to m);
  begin_
    if (ck'event and ck = '1') then
      f_count := new_f_count;
    elsif (not ck'event) then
      if (str(e) /= '1' and str(f) /= '1') then new_f_count := f_count;
      elsif (str(e) /= '1' and str(f) = '1') then new_f_count := f_count + 1;
      elsif (str(e) = '1' and str(f) /= '1') then new_f_count := -1;
      elsif (str(e) = '1' and str(f) = '1') then new_f_count := 0;
      end if;
    end if;
    lbl: for i in n to m loop
      if (str(f) = '1' and new_f_count = i) then
        x_state(i) := '1';
      else
        x_state(i) := '0';
      end if;
    end loop lbl;
    x <= x_state;
  end process;
end rtl;
```

Figure 25: VHDL Component Model Implementing For Construct, Mode In.

```
-----------------------------------------------------------
- x = f For n 'thCountSince (TimeWhen e) (mode in, n an ident, e numerical)
-----------------------------------------------------------
library tb;
use tb.tb_logic.all;

entity forboundi is
  port (f, e, ck :in tb_logic; ct :in integer; x :out tb_logic);
end forboundi;

architecture rtl of forboundi is
begin
  process (f, e, ct, ck)
    variable f_count, new_f_count :integer := -1;
  begin
    if (ck'event and ck = '1') then
      f_count := new_f_count;
    elsif (not ck'event) then
      if (str(e) = '0' and str(f) = '0') then new_f_count := f_count;
      elsif (str(e) = '0' and str(f) = '1') then new_f_count := f_count + 1;
      elsif (str(e) = '1' and str(f) = '0') then new_f_count := -1;
      elsif (str(e) = '1' and str(f) = '1') then new_f_count := 0;
      end if;
    end if;
    if (str(f) = '1' and new_f_count = ct) then
      x <= '1';
    else
      x <= '0';
    end if;
  end process;
end rtl;
```

Figure 26: VHDL Component Model Implementing For_Bound Construct, Mode In.

```
-- x = f For n 'thCountSince (TimeWhen e) (mode out, n an ident, e numerical)
------------------------------------------------------------
library tb;
use tb.tb_logic.all;
use tb.rand.all;
entity forboundo is
  port (x, e, fin, ck :in tb_ulogic; f :out tb_ulogic);
  type f_table is array (tb_ulogic) of tb_ulogic;
  constant f_array :f_table :=
  -- 'U'--'X'--'0'--'1'--'Z'--'W'--'L'--'H'--'-'--
    ('U', 'X', 'X', '-', 'X', 'W', 'X', '-', '-');
end forboundo;
architecture rtl of forboundo is
begin
  process (e, ck)
    variable irand :integer := 75000;
    variable f_delay :integer := -1;
    variable e_set :tb_ulogic := '0';
  begin
    if (ck'event and ck = '1') then
      if (f_delay > 0) then f_delay := f_delay - 1; end if;
      if (f_delay = 0) then
        f <= 'H';
      else
        f <= f_array (x);
      end if;
    elsif (ck'event and ck = '0') then
      if (str(fin) = '1') then_
        assert (x = '1');
        f_delay := -1;
      end if;
    end if;
    if (str(e) = '1') then e_set := '1'; end if;
    if (f_delay < 0 and e_set = '1') then
      irand := rand(irand);
      f_delay := scale1(irand,10) + 15;
    end if;
  end process;
end rtl;
```

Figure 27: VHDL Component Model Implementing For_Bound Construct, Mode Out.

METHOD AND SYSTEM FOR GENERATING ELECTRONIC HARDWARE SIMULATION MODELS

REFERENCE TO PROVISIONAL APPLICATION

This application claims the benefit of U.S. Provisional Application No. 60/000,162, filed Jun. 12, 1995.

BACKGROUND

1. Field of Invention

This invention relates to the generation of simulation models for electronic hardware systems. The models implement the abstraction mappings defined between the signals of a system specification model and those of a system implementation model, where the abstraction mappings are themselves expressed using a new type of specification language, termed an "abstraction language." The models created by the invention have a number of uses that include implementing key portions of simulation test bench models that control the testing of design models in multi-level simulation environments.

2. Description of Prior Art

In the development of digital electronic hardware systems, design engineers use a broad range of tools to generate and analyze models of an intended system prior to its fabrication. These tools contribute to large savings in the time and money needed to develop hardware systems by supporting the efficient generation of detailed implementation models from abstract specification models, and the detection of design mistakes early in the design process. A typical tool suite includes behavioral languages and simulators to model and exercise hardware systems at many different levels of abstraction.

For hardware expressed at low levels of abstraction, design engineers have access to commercial tools that successfully automate many design steps. For instance, these tools can synthesize integrated circuit layouts directly from design descriptions written in standard hardware description languages. The models that are input to these synthesis tools are generally written at a level of abstraction called the register-transfer level (or RTL). At this level the input and output signals of the design are represented as bits and bit vectors. Behavior is defined over these signals for every step of the system clock. RTL descriptions for complex circuits can easily fill many tens or hundreds of pages.

Because of the high complexity of RTL models, it is normally quite difficult to determine from them whether they represent a system meeting the system requirements or not. Because of this, when a requirements model is constructed for a system, the usual approach is to build it at a level of abstraction much above RTL. The term 'behavioral' level is usually given to this abstract specification level. Because of the simplicity of behavioral models, they are relatively easy to analyze and, if written in an executable language, quick to test through simulation. Behavioral models represent excellent specifications for RTL models in a top-down design paradigm.

Beginning from a well-analyzed and -tested behavioral specification model, the problem of generating an implementing RTL model can be difficult because of the vast differences in the levels of abstraction for the specification and the implementation. For example, in contrast to the bits and bit vectors of RTL models, behavioral models often employ more complex data types such as arrays, records, and enumerated types. Furthermore, the time steps used at the behavioral level might represent long sequences of RTL time steps.

For the vast majority of digital hardware design efforts today, design engineers manually construct RTL models from behavioral specifications or other informal models and ideas, and then verify the RTL models through simulation. In the past, designers verified implementation models by explicitly generating and then applying test vectors to the model. Implementation model correctness was determined by observing how well the resulting state and output changes matched their expected values. However, this approach requires a level of effort at simulation time that is normally considered to be excessive today for complex systems.

Today, a more common simulation practice is to automate much of the detailed interaction with the implementation model within a second simulation model acting as the environment for the implementation. Such environment models, often called 'test benches,' can vary quite drastically in their ability to reduce the designer workload at simulation time. At one extreme, the test bench might simply read input test vectors from a file, apply the vectors to the implementation model, and then write the implementation outputs to a second file. Such a test bench would be relatively easy to construct, but would offer little in the way of automation since the designer would still be required to generate the input vectors that are stored in the input file and to certify the results that were stored into the output file.

At the other extreme, sophisticated test benches can be constructed to not only apply test inputs to the implementation, but to also select the inputs to be applied. For the output side of the implementation, high-quality test benches would not simply forward the implementation results to an output file, but would instead certify the results against their expected values as defined by a behavioral specification. Test benches of this type are beneficial in two important respects. For one, the reduced simulation-time workload they offer hardware designers represents a direct savings in both time and money. Secondly, the increased automation used for the implementation input selection and the output certification decreases the risk of human error for these tasks. The increased rigor offered by the automation can be reflected in a more exhaustive coverage of the implementation input space, along with a lower likelihood of erroneous implementation outputs escaping detection.

A classic engineering tradeoff exists in the design of simulation test bench models. For high-quality test benches, clear benefits in simulation-time rigor and automation are countered by a greater design effort needed to construct the test bench. However, as hardware systems continue to become more complex, the tradeoff increasingly favors highly capable test benches in order to address the greater number of test cases that must be generated and analyzed. Unfortunately, the design of high-quality test benches becomes more difficult as the complexity of hardware systems increases. In fact, it is often observed today that building test benches for complex hardware implementation models can be as hard, or harder, than the construction of the implementation models themselves. It is clear that new methods and tools are needed to increase the efficiency of test bench construction over the manual methods prevalent today, and such tools should enhance the quality of the test benches that are produced.

The importance of the test bench generation problem is demonstrated by the large number of recently-described research efforts and commercial tools for automating test bench generation. The most widely used of these approaches generates test benches from interface protocol specifications expressed as timing diagrams over the input and output signals of the implementation model [ED1,ED2,EE1,EE4— see appended references at end of description]. Timing diagrams are very useful for describing interface protocol behavior at the boundaries of implementation models, and have the advantage of being intuitive and easily understood by design engineers. However, an important weakness of timing diagrams is the relative incompleteness of the information that they convey. For example, timing diagrams fail to define the data processing, or functionality, of a circuit. Because of this, timing diagrams must be augmented with methods for specifying functionality in test bench tools that provide a highly desired automated certification of implementation model outputs against designer-specified behavior. Existing methods for adding this functionality are ad hoc and duplicate effort already required for behavioral specification modeling in top-down design environments.

Another approach to automated test bench generation converts graphical state machine-based specifications into test benches [Arm,ED1]. This approach suffers an important disadvantage, however, in its lack of support for multi-level simulation environments. The state machines used in this approach, although graphical, express behavior for each step of the RTL system clock using the bits and bit-vectors of the RTL implementation. The test benches produced by this approach cannot verify RTL implementations against specifications whose operations process abstract data types or whose time steps cover multiple RTL time steps.

A third test bench generation approach generates test benches from specifications written in a new class of 'verification languages' [EE3]. However, although programs written in these languages can be more concise and easier to write than the underlying simulation programs, they still describe behavior with respect to the signals of the implementation; this approach therefore has the same problems with multi-level simulation environments as the previous approach. Because verification-language programs do not specify the mappings linking RTL implementation signals to a set of behavioral-level counterparts, the generated test benches cannot implement the mappings necessary for multi-level environments.

One approach to test bench generation known in the prior art is shown in FIG. 0. In this approach, the designer specifies one set of waveforms to be input to the implementation and a second set to serve as the basis for determining output correctness. The test bench implements the input driving and output certification precisely as defined by the waveforms input by the designer.

A number of other test bench generation approaches have been introduced in the past as well, all of which suffer from one or more disadvantages beyond the problems cited above. In summary, the fundamental problem with existing approaches is the failure to support multi-level simulation environments, where the system specification model resides at a higher level of data and temporal abstraction than the implementation model. The failure of these approaches to do so is easily explained, since none use input languages with the expressiveness necessary to specify the mappings needed to link implementations to abstract specifications. Without a specification for the mappings, the tools are incapable of implementing the mappings within their generated test benches.

SUMMARY OF THE INVENTION

In a general sense, the invention provides a method and a system for generating simulation models that implement the information contained in abstraction specifications. FIG. 1 is a schematic overview of the invention in its most general form. In the context of the invention, 'abstraction specifications' define the relationships between the signals of concrete implementation models (a and z of the figure) and the signals of abstract specification models (A and Z of the figure), as will be discussed subsequently. Implementation models in this context include those expressed at detailed timing levels, the gate level, and the register-transfer level (RTL). Specification models are expressed at higher levels of data and temporal abstraction than their underlying implementation models. Models are expressed at different levels of data abstraction when they use different data types for their signals, and they are expressed at different levels of temporal abstraction when their basic time steps represent different durations of real time. Abstraction specifications are also termed 'abstraction models' in this description. A thorough definition of 'abstraction model,' as it is used throughout this description, and in the claims, is provided in the 'Abstraction Models' section later in this description.

FIG. 2 is a schematic view of self-testing test benches generated by the invention, showing a specific application of the general method and system just described. Here the invention provides a method and system for generating simulation test bench models to control the testing of implementation models against specification models expressed at higher levels of abstraction. The test bench shown in this figure reads one or more commands and data values from an input file 200. The 'select input' subsystem 202 uses this file input to determine values A to be read by both the specification 206 and the 'map down' subsystem 204 (input values A represent the specification-level data values transmitted during each individual specification-level time step). The subsystem implements input data selection using a number of approaches, some of which are implemented internal to the test bench to eliminate the need for user-defined test vectors. The 'map down' subsystem 204 converts specification values A into implementation values a expressed at the abstraction level of the implementation 208 (input values a represent data values transmitted over one or more implementation-level clock cycles, and whose number and data types can differ from the number and data types of the specification-level values A). The implementation 208 processes the input values a to produce output values z that are read by the 'map up' subsystem 212. The 'map up' subsystem 212 converts output values z into specification-level output values $Z_d$ that are read by the 'certify output' subsystem 210. Similarly, the specification 206 processes its input values A to produce output values $Z_s$ that are also read by the 'certify output' subsystem 210. The 'certify output' subsystem 210 compares its inputs $Z_s$ and $Z_d$ to determine the correctness of the implementation 208 against the behavior expressed by the specification 206. The results of the comparison are written to an output file 214.

The invention exploits a previously unknown advantage of abstraction models to provide the first method and system to automatically generate self-testing test benches of the form described in FIG. 2. This class of automatically generated test benches is unique in its instantiation of an existing specification model in addition to an existing implementation model. Such a specification model would already exist in many top-down design environments, where it would support fast system-level simulations in addition to serving as the basis for evaluating the correctness of the implementation. As a 'stand alone' simulation model, this type of specification can be subjected to intensive testing prior to its role in certifying the implementation. As discussed above, other test bench generation tools require the user to develop specifications specific to the test bench, and they offer poor support for testing these specifications prior to their use in certifying the implementation.

The unappreciated advantage of abstraction models relates to their basic ability to define mappings that fully span the gap between signals of specifications and of implementations, even when the signals are expressed at different levels of data and temporal abstraction. This directly supports the invention's ability to synthesize the 'map down' subsystems 204 and 'map up' subsystems 212 necessary to translate the signals of the specification 206 and implementation 208 among the two levels of abstraction. Such translations are clearly necessary to permit the data values expressed at different levels of data and temporal abstraction to be compared in an output certification process. The invention is able to generate test benches of the form shown in FIG. 2 because it is the first to use abstraction models for the input to the test bench generation process.

FIG. 3 is a schematic view of specification test benches generated by the invention. Specification test benches control the testing of specification models in isolation from implementation models. The 'select input' subsystem 302 and specification 304 shown in FIG. 3 can be the same as their namesakes in FIG. 2. The 'store output' subsystem 306 forwards the specification output results to output file 308. Advantages of this class of test benches produced by the invention include fast execution speed, efficient certification of specification model correctness using abstract data values, and the ability to exercise specification models before implementation models are available.

FIG. 4 is a schematic view of implementation test benches generated by the invention. Implementation test benches control the testing of implementation models in isolation from their specification models. In these test benches, the 'select input' subsystem 402, 'map down' subsystem 404, implementation 406, 'store output' subsystem 408, and 'map up' subsystem 410 can be the same as their namesakes in FIGS. 2 and 3. Advantages of this style of test bench include the ability to test implementations in the absence of specification models and, at the same time, to permit a more efficient user interaction with the simulation process using the abstract input and output values of the specification, rather than the complex sequences of the implementation.

FIG. 5 is a schematic view of protocol test benches generated by the invention. Protocol test benches support the visual display of interface protocols using the graphics supplied by existing simulators. This class of protocol test benches contains two separate regions, denoted the 'master' region 528 and the 'slave' region 530, each of which contains the test bench subsytems used in the implementation test benches shown in FIG. 4. The 'select input' subsystem 504 and 'map down' subsystem 506 of the 'master' region 528 implement the functionality of the environment for the implementation (e.g., implementation 406 of FIG. 4) consistent with their namesakes shown in FIGS. 2–4. On the other hand, the 'select input' subsystem 520 and 'map down' subsystem 522 of the 'slave' region 530 implement the functionality of the implementation itself. The 'master' waveform 512 and 'slave' waveform 514 represent the signal relationships displayed on the graphical user interface of existing commercially-available simulators. The 'map up' subsystems 510 and 518 and 'store output' subsystems 508 and 516 of the two regions store abstract versions of the implementation waveforms into output files 502 and 524, respectively. The advantages of protocol test benches include the ability to graphically display the relationships defined by electronic system interface protocols (embedded in abstraction specifications) using the graphical capability already provided by existing simulators, independent of whether the original protocol is expressed in a graphical notation or a textual notation.

FIG. 6 is a schematic view of bit-true specifications generated by the invention. Bit-true specification models are simulation models whose interfaces use the signals of the implementation, but whose internal behavior uses the abstract functionality of the specification. The class of bit-true specifications described by FIG. 6 augments a specification 602 with a 'map up' subsystem 600 and a 'map down' subsystem 604 to implement the implementation-level interfaces. The advantages of bit-true specification models include their faithful representation of implementation-level input and output, combined with fast internal execution owing to the abstract operations performed internally. The uses of bit-true specifications include modeling elements of an electronic hardware system's environment in scenarios where the environment implements data processing and/or storage.

In a behavioral synthesis system that utilizes this invention, an implementation would be synthesized from the information contained in (i) an abstraction specification and (ii) a behavioral specification. The invention provides a method and system for converting abstraction specifications into simulation model segments that implement the interfaces of the implementation being synthesized. These segments include state-holding devices that latch implementation data inputs at the appropriate times, and the finite-state machines that implement the interface protocol control.

Thus, in accordance with a first aspect, the invention is a method for generating a simulation model of an electronic hardware system comprising the steps of providing an abstraction model for the system and then analyzing the abstraction model to produce a simulation model that implements the abstraction model. Further, in accordance with a second aspect, the invention is a system for analyzing an abstraction model to generate a simulation model that implements the abstraction model.

Further advantages and features of the invention will become apparent from a consideration of the drawings and ensuing descriptions and claims.

BRIEF DESCRIPTION OF THE DRAWINGS

FIG. 0 is a schematic view of test benches generated by prior art tools.

FIG. 1 is a schematic overview of the invention in its most general form.

FIG. 2 is a schematic view of self-testing test benches generated by the invention.

FIG. 3 is a schematic view of specification test benches generated by the invention.

FIG. 4 is a schematic view of implementation test benches generated by the invention.

FIG. 5 is a schematic view of protocol test benches generated by the invention.

FIG. 6 is a schematic view of bit-true specifications generated by the invention.

FIG. 7 is a schematic overview of the invention internal blocks and interfaces, in accordance with the preferred embodiment of the invention.

FIG. 8 is is a schematic overview showing the role of abstraction modeling in relating implementation signals to specification signals.

FIG. 9 is a schematic view of a single-bit full-adder circuit example with a four-phase interface protocol.

FIG. 10 is a schematic view of an exemplary abstraction model segment demonstrating sampling-based abstraction.

FIG. 11 is a schematic view of an exemplary abstraction model segment demonstrating selection-based abstraction.

FIG. 12 is a schematic overview of the source translator of the preferred embodiment of the present invention.

FIG. 13 is a schematic view of the data structures used to represent signals and components in the preferred embodiment of the present invention.

FIG. 14 is a schematic view of the translation process for abstraction model signals in accordance with the present invention.

FIG. 15 is a schematic view of the translation process for aliased time declarations in accordance with the present invention.

FIG. 16 is a schematic view of the translation process for an exemplary abstraction formula in accordance with the present invention.

FIG. 17 is a schematic overview of an intermediate structure for the exemplary VIL model shown in FIG. 10.

FIG. 18 is a schematic overview of an intermediate structure for the exemplary VIL model shown in FIG. 11.

FIG. 19 is a schematic overview of the process for updating intermediate structures, in accordance with the present invention.

FIG. 20 is a schematic overview of the flow of mode updates following their initial assignment, in accordance with the present invention.

FIG. 21 is a schematic overview of elements of a generated VHDL simulation model for the exemplary intermediate structures of FIGS. 17 and 18, in accordance with the present invention.

FIG. 22 is a schematic overview of elements of a generated VHDL simulation model implementing input selection and output recording, in accordance with the present invention.

FIG. 23 is a schematic view of a VHDL component model implementing a VIL 'at' construct with mode in.

FIG. 24 is a schematic view of a VHDL component model implementing a VIL 'at' construct with mode out.

FIG. 25 is a schematic view of a VHDL component model implementing a VIL 'for' construct with mode in.

FIG. 26 is a schematic view of a VHDL component model implementing a VIL 'for' construct with mode in.

FIG. 27 is a schematic view of a VHDL component model implementing a VIL 'for' construct with mode out.

DETAILED DESCRIPTION OF THE PREFERRED EMBODIMENT OF THE INVENTION

FIG. 7 is a schematic overview of the invention internal blocks and interfaces, in accordance with the preferred embodiment of the invention. As explained above, the invention 702 generates simulation models 704 that implement abstraction mappings defined in abstraction models 700. The invention 702 itself contains three main blocks. The source translator 706 converts an abstraction model 700 into an intermediate structure 708. The abstraction models 700 can be expressed using textual notations, graphical notations, or a combination of each. The intermediate structure 708 is a collection of data structures including hash tables, syntax trees, and linked lists. The target translator 710 converts the intermediate structure 708 into one or more simulation models 704 according to instructions provided by the user. The simulation models 704 that are generated include all of the forms described above.

The invention has been implemented in the programming language C within a suite of electronic design automation (EDA) tools under development at Levetate Design Systems. In the current implementation, the abstraction models are written in a new abstraction language called VIL (VHDL Interface Language) and the simulation model outputs are expressed in VHDL (VHSIC Hardware Description Language [IEE]). The current test bench generation tool is called Test Bench Tool (TBT).

Abstraction Models

Abstraction models are new to the commercial EDA and hardware design communities, having evolved from recent research in the discipline of higher-order logic theorem proving (e.g., [Me1,Fu1,Fu2,Fu3,Fu5]). An abstraction model acts as a bridge connecting a description of a system's specified behavior to a description of its implemented behavior. Of significance is the fact that these descriptions can be expressed at different levels of structural, data, or temporal abstraction.

In this description, and in the claims, two behavioral models are said to differ with respect to structural abstraction when they contain different numbers of internal components; they differ with respect to data abstraction when they employ different data types; and they differ with respect to temporal abstraction when their basic units of time are different, that is, when the operations implemented by each model require differing amounts of real time for their completion.

Abstraction models are used in multi-level theorem prover-based hardware verifications to relate the signals of abstract specifications to those of underlying implementations, since these relationships are necessary in proving that the implementations satisfy their specifications. However, abstraction models have not been required in the past for simulation-based verification environments; instead, abstraction mappings have been implemented only implicitly when design engineers interpret waveforms on a computer monitor, or when design engineers construct test bench models to test implementations against abstract specifications. Repeating from above, the new abstraction language VIL is the first known language available to model system abstraction in the context of simulation environments.

In this description, and in the claims, when we refer to an abstraction model we mean a model containing the following three elements:

(a) A definition of one or more input, output, or state signals expressed at the level of abstraction of a specification model, where each signal is characterized by (i) a name, (ii) a type, and (iii) a directionality.

(b) A definition of one or more input, output, or state signals expressed at the level of abstraction of an implementation model, where each signal is characterized by (i) a name, (ii) a type, and (iii) a directionality.

(c) A definition of the mapping between the specification signals of (a) and the implementation signals of (b), where the signals of (a) and (b) can be partitioned into a 'source' set and a 'target' set such that each of the signals in the target set is defined in terms of one or more signals in the source set by way of the mapping. An example of such a mapping is one that defines each specification-level signal in terms of one or more implementation-level signals. In such a scenario, the implementation-level signals and mapping are sufficient to define each specification-level signal's name, type, and directionality, in addition to its relationship to the implementation-level signals.

FIG. 8 is a schematic overview showing the role of abstraction modeling in relating implementation signals to specification signals. FIG. 8 shows an example where the implementation is expressed at the RTL, in which the basic unit of time corresponds to one cycle of the system clock and the data are typically bits and bit-vectors. The specification is expressed at the transaction level [Fu1], where a unit of time represents an entire transaction worth of behavior and the data are more appropriately expressed using abstract data types such as arrays, records, and enumeration types.

FIG. 9 is a schematic view of a single-bit full-adder circuit example with a four-phase interface protocol. This example will be used to illustrate many of the concepts presented in this description. This example was previously described in [Fu4,Fu5]. Part (a) of the figure describes the top-level structure of the implementation for the adder, showing the input and output signal names and their directionalities. The timing diagram of part (b) provides an informal description of the protocol used by the adder to communicate with its environment. The darkened regions on the diagram indicate the times at which the associated data signals are required to be correct.

The control signals rqtin and ackout carry the directionalities implied by their names, with the environment sourcing the request signal rqtin and the adder driving the acknowledgement signal ackout. In the protocol implemented by these two signals, it is assumed that rqtin and ackout are both low prior to the beginning of a transaction. The signal rqtin is brought high by the environment to initiate a new transaction. In response to this transition, the adder cell is required to raise ackout; in turn, the environment is required to then lower rqtin, an act which leads to the subsequent lowering of ackout as well. Although this is not explicitly evident from the diagram, it is assumed that the transitions are unbounded in time; they must occur 'eventually' at some future points in time. The times shown at the bottom of the figure mark the signal transitions just described.

Sampling-Based Abstraction

FIG. 10 is a schematic view of an exemplary abstraction model segment demonstrating sampling-based abstraction. FIG. 10 shows segments of a VIL abstraction model for the adder system just described. VIL models contain several major types of blocks, from which three required blocks are shown in this figure. The specification entity block on lines 1–8 defines the names, types, and directionalities for specification-level signals (lines 5 & 6). It also provides a place to declare new types and subtypes (lines 2 & 3). The design entity block on lines 10–15 defines the names, types, and directionalities for implementation-level signals (lines 12 & 13). Finally, the abstraction block on lines 17–27 defines the mappings between the signals of the specification and the signals of the implementation (lines 22–25). Those readers familiar with VHDL will recognize many VHDL constructs in the VIL code used in this example.

The aliases on lines 18 and 19 of the model provide shorthand notation for two significant concrete times of the four-phase protocol used in this example. The concrete time t' is a VIL reserved word denoting the beginning of the t'th transaction. It is defined here as the time when rqtin changes to '1' for the t'th count since time 1. This time corresponds to the time t_rqt' of FIG. 9. The second alias defines t_ack' as the time when the adder raises ackout for the first time since the beginning of the transaction. All 'counts' in VIL are natural numbers that begin at 0.

As might be inferred from above, the abstract time t is another reserved word in VIL denoting the t'th, or 'current,' specification-level time (the transaction count). VIL models define abstraction mappings by focusing on an arbitrary single (the t'th) transaction.

Lines 22–25 of the model define four specification-level signals with respect to the underlying implementation signals. Line 22 defines the values carried by specification-level signal A in terms of values carried by implementation signal a. The formula on line 22 says that input A is an integer version of implementation signal a sampled at time t', which is again the beginning of the transaction. The formulas on lines 23 and 24 have a similar interpretation with respect to the data inputs b and cin. Line 25 defines the specification-level data output COUT_SUM as an integer version of cout and sum, sampled at t_ack' and concatenated left to right.

VIL supports the modeling of multiple processes at the specification level through the use of special keywords. In addition to the keyword t used above, VIL provides the keywords t0, t1, etc. to permit an arbitrary number of specification-level clocks to be defined. Each clock corresponds to a separate specification-level state machine defining the behavior of an independent process. The concept for this approach to specification-level modeling was previously described in [Fu1,Fu5]. The specification-level signals of a VIL model are assigned to processes based on which specification-level clock variable they use within their mapping formula. The keywords t0', t1', etc. are used to represent the beginnings of the current specification-level operation for processes t0, t1, etc.

Selection-Based Abstraction

FIG. 11 is a schematic view of an exemplary abstraction model segment demonstrating selection-based abstraction for the example adder system under consideration. Line 2 of the model is a type declaration for an enumeration type containing the two values SAT and XXX. This type is used by the specification 'opcode' signals RST_OP and LIVE_OP declared on line 4 the model. Specification opcodes in VIL carry abstract representations of implementation-level control signal behavior. A specification signal carrying the value SAT represents a scenario where the implementation control signals are satisfying their protocol. The value XXX is used to represent control signal behavior that is not in conformance with a specified protocol.

All hardware system implementations require correctly behaving environments for their correct operation. For example, hardware systems require the system reset to remain inactive in order to successfully complete their normal operations. The RST_OP opcode carries the specification-level representation of this very constraint. Lines 16 and 17 of the VIL model segment show RST_OP carrying the value SAT precisely when the RTL reset is high at time 0 and low for all times afterwards. The RTL reset is therefore seen to implement its protocol when it does not interrupt processing following the initial system start-up.

The mapping for the specification signal LIVE_OP, on lines 18 and 19 of the model, says that LIVE_OP is SAT precisely when rqtin changes to '1' for the t'th count since 1 at time t', where t' is defined in FIG. 10. A value of SAT for this signal indicates that the environment initiates the t'th (or current) transaction. The motivation for this signal is provided in later parts of this description.

Source Translation

In FIG. 7, the first step in the simulation model generation process was shown as a source translation step that converts an input abstraction model into an intermediate structure. FIG. 12 provides a more detailed description of this step for the current preferred embodiment. As shown in the figure, the source translation consists of two sub-steps: build intermediate structure 1202, and update intermediate structure 1204.

Build Intermediate Structure

To begin the intermediate structure build, the input VIL abstraction model is scanned and parsed using standard methods and tools. Calls to C language functions are embedded in the scanner and parser source code to implement the construction of the intermediate structure. As the specification and implementation entity blocks are parsed, the declared types and signals are stored into data structures consisting mainly of linked lists of C-language structures. Implementing these declarations uses methods already established in the prior art.

FIG. 13 is a schematic view of the data structures used to represent signals and components in the preferred embodiment of the present invention. The signal node definition in part (a) contains fields for the signal name, type, and directionality, or mode, as well as a pointer to the next signal node in a linked list of nodes. The final field, comp, is used to link the signal node to the component node 'owning' the signal. This concept will become more clear in the descriptions below.

Part (b) of FIG. 13 shows the relevant parts of the node structure for components. The structure contains one field for the component name, one field to link the node to the next node in a linked list of nodes, and five fields (f1,f2,f3,f4,u5.f5) linking the component node to signal nodes. The integer field u5.i5 is used in certain component types in ways that will become clear in the descriptions below.

Source Translation Theory

The translation of VIL formulas into intermediate structures is highly syntax-directed and uses a procedure with a rigorous foundation in formal logic. FIG. 14 is a schematic view of the translation process for abstraction model signals in accordance with the present invention, showing a simple example to demonstrate each of these two points. The example begins with a signal-based formula in part (a) that is to be translated into an implementing structure. The formula is termed signal-based because the entities on each side of the equals (*=) operator are signals. In higher-order logic, signals are conveniently represented as functions that map from time (usually a natural number) into the type appropriate for the signal (e.g., boolean, four-valued logic, bit-vector, etc.). The formula in part (a) says that, at every point in time, the signal x carries the same value as the signal (f and g) implies (not h).

Formal reasoning implemented using a higher-order logic theorem prover can be used to show that the signal formula of part (a) is equivalent to the decomposed formula in part (b). This new formula says that there exist two signals x1 and x2 such that three things are true: (i) x1 is equivalent to f and g, (ii) x2 is equivalent to not h, and (iii) x is equivalent to x1 implies x2. The use of the star ('*') in front of some of the operators in this formula indicates that the operator produces a value rather than a signal. For example, a value fv *and gv is the logical conjunction of boolean values fv and qv, while a signal f and g carries, at every point in time, the logical conjunction of the two signals f and g sampled at the same points in time. In this latter case the two signals f and g are both functions that map from time to booleans.

The formula in part (b) is interesting because of its similarity to constructs found in hardware modeling using higher-order logic theorem provers. For example, in [Gor] structural hardware implementations use a form where existentially quantified signals (such as x1 and x2 here) are interpreted as signals internal to structures, and logical conjunction (*and here) is used to structurally compose individual components into circuits.

The structure in part (c) of the figure results directly from this observation. Here the three conjuncts of part (b) are enclosed within their own components and the existentially quantified signals are assigned to internal nodes of the resulting circuit. Provided that implementations can be found for the individual components, we can be assured, by formal proof, that the synthesized structure of part (c) implements the VIL formula of part (a). However, the structure involved in such a proof would necessarily be implemented in the language of a theorem prover and would need translation into the appropriate simulation language. In [Fu5], formal logic implementations for several types of components are described, and the straightforward translation of these component models into VHDL is demonstrated.

The actual translation of the formula in part (a) of FIG. 14 is implemented in TBT using a straightforward syntax-directed approach. As the formula is parsed, the first reduction reduces the complex signal f and g to a new signal x1. This reduction has associated with it a call to a function to emit the new internal test bench signal (x1) of the appropriate type and a new 'And' component representing x1 *=f and g. Referring to a comment from above, the newly-generated signal x1 is 'owned' by the new 'And' component. The next reduction reduces the signal not h to a new signal x2 of the appropriate type and emits a new 'Not' component. Finally, a third reduction causes the emission of an appropriately-typed x and an 'Implies' component. The built-in parser stack is used to help maintain the correct relationships among the emitted signals and components.

FIG. 15 is a schematic view of the translation process for aliased time declarations in accordance with the present invention. Part (a) of FIG. 15 lists the actual VIL syntax for the declaration, repeated from line 18 of FIG. 10. The declaration says that time t' is the time when rqtin changes to '1' for the t'th count since time 1. As explained above, this declaration defines t' as the beginning of the t'th transaction. It also has the effect of defining rqtin->'1' as the 'boundary event' for the protocol under consideration. Boundary events are implementation-level events (or signals) defining the boundaries of specification-level operations (transactions in this example).

Part (b) of FIG. 15 shows how the alias declaration is interpreted as a logical formula. This formula defines a new signal x_tprime to represent the time t'. Signals are used to represent times in test bench generation since they are the primary means of communicating information among simulation model components. The signal x_tprime carries a high value precisely when the signal rqtin changes to '1' for the t'th count since 1. This signal is used for all test bench components that implement VIL constructs incorporating t'.

Finally, part (c) of FIG. 15 shows the decomposition of the part (b) formula into a two-component structure, containing a 'Changes_To' component and a 'For_Bound' component. Additional details are provided for this example later in the description.

In the two examples just presented, methods were described for handling formula decomposition and test bench circuit generation, first for signals and then for times. The third, and final, example of this section illustrates the handling of values. FIG. 16 is a schematic view of the translation process for an exemplary abstraction formula in accordance with the present invention. Part (a) of FIG. 16 repeats a formula fragment from lines 16 and 17 of FIG. 11. This formula says that the value x is high ('1') precisely when signal reset carries the value '1' at time 0 and carries '0' for all times afterwards.

Part (b) of FIG. 16 shows the decomposition of the formula into a conjunction of five sub-formulas. This decomposition uses the same syntax-directed methods described above and produces a structure containing two 'Is' components, one 'At' component, one 'During' component, and one 'And' component. However, the justification for this decomposition is only partly supported by the explanations from above. In particular, the prior discussion was directed to VIL formulas employing signals, whereas the formula under consideration here operates over both signals and values. For example, in the sub-formula X5 *=x4 at 0, each side of the equivalence is a value, with X5 equal to the value of signal x4 sampled at time 0. The capitalized names used for X5, X7, and X indicate that they too are values rather than signals.

At this point in the decomposition there are no difficulties in formally justifying the individual steps, as the decomposed formula of part (b) can be proved equivalent to the original formula in part (a). However, problems do occur in the implementation of the sub-formulas as simulation model components, since simulation languages provide operators that directly process signals rather than values. The component models used in hardware modeling in higher-order logic likewise process signals rather than values. Component modeling in each of these disciplines fails to provide a direct way to implement value-based expressions such as X5 *=x4 at 0.

General value-based formulas such as X *=f at tx' are nontrivial to implement using signal-based simulation components because they make statements about signal values without regard to how far the simulation has progressed. For example, this formula is making a statement about the value for X that is valid even at simulation start-up. However, a simulation-based implementation does not know whether the formula is true until the time tx' is reached in the simulation.

To get around these problems in simulation-based implementations, it is sufficient to use component models that implement value-based formulas only when certain well-defined and expected conditions are met. If the conditions are not met during an actual simulation run then component models can invalidate the simulation run by dumping error messages to the transcript window, for example. This is the approach taken by TBT.

Although the syntax-directed methods were demonstrated above for only a small subset of the operators available in VIL, the examples illustrate the basic procedure common to all VIL operators. Table 2 provides data to support the extension of the above discussion to the remaining operators of the current VIL language. Those skilled in the art will understand from these demonstrations of syntax-directed methods that other operators from Table 2 could be used with equal assurance as those actually used in the exemplary demonstrations.

Intermediate Structure for Sampling-Based Abstraction Example

FIG. 17 is a schematic overview of an intermediate structure for the exemplary VIL model shown in FIG. 10. The structure is a complete description of the relevant signal and component nodes for this example aside from the absence of sub-circuits for the specification-level signals B and CIN. These essentially repeat the sub-circuit for A. All signal nodes are displayed in the figure as circles (or ellipses) and all component nodes are shown as squares (or rectangles). The intermediate structure shows the names for the signals even though they are actually assigned by the subsequent 'update intermediate structure' step rather than the 'build intermediate structure' step under consideration here. The names are displayed to improve the clarity of the following discussion.

The signal nodes 1700, 1706, and 1719 shown on the upper left hand side of FIG. 17 store information for the two declared aliases of the VIL model, plus an additional alias introduced by TBT. Each of these signal nodes points (using their comp fields) to an Alias component that heads up a circuit implementing the alias declaration. The Alias components, in turn, point (using their f1 fields) to internal signal nodes heading up the circuits that are effectively instantiated whenever the aliases are used in subsequent alias declarations or abstraction mappings. For example, the alias declaration for t' in a VIL model results in the generation of a signal node for t' 1706, its Alias component 1710, and an internal signal node for x_tprime 1707. It is the signal x_tprime that is instantiated within the test bench when t' is used in the VIL model, as seen by its repeated presence as a number of additional nodes (1729, 1742) in FIG. 17.

The node for aliased signal 1 1700 was introduced by TBT when the 1 was encountered as a time in line 18 of the VIL model (again, FIG. 10). The circuit for this alias represents the formula x_1 *=xtime=1, which says that x_1 is high precisely when xtime is equal to 1. The signal xtime is the integer-valued implementation-level time. It is incremented on rising edges of the implementation-level clock x_clock. All internal alias signal names are prefixed by "x_", where x is a user selectable prefix for implementation-level signal names.

The circuit for aliased signal t' contains two main components, consistent with the discussion above and with the description in FIG. 15. The 'Changes_To' component 1712 represents the formula x0 *=x_rqtin->'1', where x_rqtin is the internal node representation for the implementation-level signal rqtin. The 'For_Bound' component 1711 represents the formula x_tprime *=x0 for t'thcountsince 1. The x_1 signal node 1716 is used in the circuit, rather than 1 itself, for implementation reasons hinted at above, and further discussed below. The xcount signal node 1717 is used by the implemented 'ForBound' component to measure the accumulated count t, which is the transaction-level time.

The 'Alias' component nodes for t' and t_ack' (1710 and 1723, respectively) point to 'event occurrence' nodes for signals x_tprimev and x_t_ackprimev (1715 and 1728, respectively). The purpose of these nodes is to support the reporting of missing time-defining events during simulation runs. This is explained in more detail below.

The signal nodes 1732 and 1743 shown on the lower left hand side of FIG. 17 store information for two of the specification-level signals of the example VIL model of FIG. 10. Similar to the aliased signals discussed above, these two nodes point to 'Abs' components (1736 and 1750) heading up circuits implementing the mappings between the specification-level signals and the implementation-level signals shown at the right hand side of the figure. The two circuit structures result from a straightforward application of the syntax-directed translation methods described earlier. The 'Cat' component 1753 represents signal concatenation (the VIL (and VHDL) '&' operator').

The signal nodes 1714, 1727, 1740, 1749, and 1755 shown on the right hand side of FIG. 17 store information for implementation-level signals. These signal nodes point to Tbif components (1713, 1726, 1739, 1748, and 1754) providing the implementation-level 'tails' for the circuits implementing the abstraction mappings.

Intermediate Structure for Selection-Based Abstraction Example

FIG. 18 is a schematic overview of an intermediate structure for the exemplary VIL model of FIG. 11. As in FIG. 17, the signal nodes at the left hand side of FIG. 18 (1800 and 1823) represent specification signals, while those on the right (1815 and 1836) represent implementation-level signals. The 'Abs' components 1809 and 1829 and the 'Tbif' components 1814 and 1835 define the heads and tails of the circuits for RST_OP and LIVE_OP, respectively.

The 'Cond' component 1810 represents the formula y_RST_OP *=SAT *when x8 *else XXX, where y_RST_OP is an internal representation for RST_OP. The components comprising the circuit headed by signal x8 1805 represent the decomposed reset formula shown in FIG. 16(b).

Update Intermediate Structure

The 'update intermediate structure' step 1202 of the source translator shown in FIG. 12 is executed after the VIL model is parsed and the initial intermediate structure is constructed. FIG. 19 is a schematic overview of the process for updating intermediate structures, in accordance with the present invention. FIG. 19 shows the breakdown of this step into three sub-steps, the first of which is conditional. The 'build slave circuit' step 1902 is executed to build 'slave' circuits for protocol test benches and is only executed when this tool option is selected by the user. The 'update modes' step 1904 and 'update names' step 1906 are executed for all test bench generation options.

Generating Slave Circuits

Generating slave circuits is implemented by a single core process that is executed for each specification signal node of the intermediate structure. For each node the process begins by making a copy of the specification signal node and reversing the directionality of the signal: an existing directionality of out is changed to in for the new signal and vice versa. The newly generated specification signal nodes are added to a 'reverse specification signal list.' In addition, a 'reverse implementation signal list' is constructed containing nodes whose directionalities are reversed from those of the original implementation signal list. A Tbif or Tbio component is also generated for each node of the new list.

After generating a new specifcation signal node, the process uses a recursive procedure to copy the circuit headed by the original specification signal node into a new circuit headed by the new specification signal node. The procedure traverses every component node in the original circuit until it reaches the terminating Tbif or Tbio components. Upon reaching a Tbif or Tbio component, the procedure ensures that a mirror version of the component exists, along with a mirror version of the associated implementation signal node that is owned by the component. The structure of the newly implemented reverse circuit is identical to that of the original circuit.

Setting Modes

During the parsing of VIL entity blocks, directionalities, or modes, are established for the declared specification-level signals and the declared implementation-level signals. VIL supports three VHDL modes: in, out, and inout, for inputs, outputs, and bi-directional signals, respectively. All of the modes present in VIL models represent the directionality from the point of view of the specification/implementation. However, the modes stored with the signal nodes in the intermediate structure define the directionality from the point of view of the test bench, and require a straightforward mode reversal. For example, the input specification signal A of FIG. 10, line 5 is represented as an output signal A (1732) in the intermediate structure of FIG. 17.

An initial assignment of modes is made for the declared specification signal nodes and the declared implementation signal nodes of the generated intermediate structure. This assignment uses the mode values contained in the VIL model and is performed within the 'build intermediate structure' step of the source translator. In the 'update intermediate structure' step, mode assignments are made for the remaining signal nodes of the generated test bench. These nodes are not associated with specific signal declarations, but instead correspond to signals internal to the generated simulation model.

FIG. 20 is a schematic overview of the flow of mode updates following their initial assignment, in accordance with the present invention. The core element of the process is a top-down, recursive procedure that is executed for each of the declared specification signals. The procedure begins at the specification signal nodes and visits each component node of their respective 'circuits' until reaching the terminating Tbif or Tbio components. In FIG. 20, the procedure begins at the nodes for A1 2000 and Z1 2002 and terminates at the implementation nodes a1 2036, z1 2038, and b1 2040. The intermediate components 2006, 2012, etc. are visited along the way. To save space, the signals associated with the intermediate components are omitted from FIG. 20.

As each component node is visited by the mode update procedure, modes are established for each of the appropriate component signal fields f2, f3, f4, and f5. The determination for each of these fields is made based on the component type and on the mode value for the 'input' field f1. Table 2 describes the mode assignment combinations for each of the implemented component types. In the case of a conflict in the mode assignment for an internal signal, a mode of out over-rides a mode of in.

The detection of illegal mode combinations is made when the procedure reaches the terminating Tbif and Tbio components. Illegal mode combinations in this context are due to incompatibilities between the declared modes of the specification signals and the implementation signals of the input VIL model. A mode error is flagged for a declared implementation signal when the mode declared for the signal is in and the mode propagated to field f1 of the signal's Tbif component is out.

Setting Names

Signal names are established during the 'build intermediate structure' step for the signal nodes implementing the declared specification signals and the declared implementation signals. In the 'update intermediate structure' step, names are established for a subset of the signals internal to the intermediate structure. The set of signals that receive names is determined by the types of components associated with the signals and by the modes of the signals themselves.

The assignment of names to signals uses a recursive procedure with the same structure as the mode update procedure. Table 2 defines the conditions under which names are assigned to signals for each of the implemented components.

Target Translation

In the current preferred embodiment of the invention, the structure of generated simulation models bears a strong resemblance to that of the intermediate structure just discussed. In most cases, individual component nodes within the intermediate structure are implemented as individual VHDL components or statements in the generated simulation model. In some cases, two or more component nodes map into a single VHDL component or statement. Only in a small number of cases do nodes present within the intermediate structure have no direct counterpart within the generated simulation model.

Three fundamental issues concerning the correctness of generated simulation models relate to: (i) the correctness of the VHDL models used for the individual components and statements, (ii) the correctness of the component interconnection modeling, and (iii) the correctness of the generated structure itself; i.e., are the components hooked up correctly? A significant advantage of the preferred embodiment is the manner in which it addresses each of these issues. To begin, the straightforward mappings used between the nodes of intermediate structures and the components of generated simulation models simplify the assurance of correct simulation model structures—correctness item (iii). The use of advanced data types and node resolution functions available in VHDL addresses correctness item (ii). Finally, the relatively simple behavior being implemented by each individual VHDL component leads to a straightforward assurance of correcntess for item (i).

Test Bench Data Type and Functions

A new VHDL data type is used to model logic signals within the test benches generated by the invention. The type, called tb_logic, uses the same nine named values of the standard std_logic data type, but with a different interpretation of these values as shown here:

'U'—unitialized

'X'—forcing unknown (illegal value—cannot be low, high, or high impedance)

'0'—forcing low

'1'—forcing high

'Z'—high impedance

'W'—weak unknown (eventual low or high)

'L'—weak low (eventual low)

'H'—weak high (eventual high)

'-'—don't care (unconstrained—can be low, high, or high impedance)

The value 'U' is used to represent uninitialized signals, 'X' represents overconstrained signals which result, for example, from a simultaneous driving of low and high values onto a single node. The values '0', '1' and 'Z' are used in the standard way to represent low, high, and high impedance values, respectively.

The value 'L' is used to represent a signal that must eventually go low, but that is not required to do so at the current time. Similarly, the value 'H' is used to model an eventual high value. The value 'W' indicates the simultaneous driving of 'L' and 'H'. Finally, the value '-' is used as a don't care value, one that can be either of the primary legal values '0', '1', or 'Z', but where the actual value is unknown.

Table 1 shows the VHDL resolution function used to resolve multiply-driven nodes within the test benches generated by the invention. The form of this table is the same as that of the table for the standard VHDL std_logic data type. The table for tb_logic has primary differences in its handling of the values '-' and 'Z'. For example, in tb_logic the two values '-' and '-' resolve to '-' rather than 'X'. Furthermore, the two values '0' and 'Z' resolve to 'X' in tb_logic rather than '0' as in std_logic.

TABLE 1

Table for tb_logic Node Resolution Function.

| | 'U' | 'X' | '0' | '1' | 'Z' | 'W' | 'L' | 'H' | '—' |
|---|---|---|---|---|---|---|---|---|---|
| 'U' | 'U' | 'U' | 'U' | 'U' | 'U' | 'U' | 'U' | 'U' | 'U' |
| 'X' | 'U' | 'X' | 'X' | 'X' | 'X' | 'X' | 'X' | 'X' | 'X' |
| '0' | 'U' | 'X' | '0' | 'X' | 'X' | '0' | '0' | '0' | '0' |
| '1' | 'U' | 'X' | 'X' | '1' | 'X' | '1' | '1' | '1' | '1' |
| 'Z' | 'U' | 'X' | 'X' | 'X' | 'Z' | 'Z' | 'Z' | 'Z' | 'Z' |
| 'W' | 'U' | 'X' | '0' | '1' | 'Z' | 'W' | 'W' | 'W' | 'W' |
| 'L' | 'U' | 'X' | '0' | '1' | 'Z' | 'W' | 'L' | 'W' | 'L' |
| 'H' | 'U' | 'X' | '0' | '1' | 'Z' | 'W' | 'W' | 'H' | 'H' |
| '—' | 'U' | 'X' | '0' | '1' | 'Z' | 'W' | 'L' | 'H' | '—' |

Generating Mapping Operations

FIG. 21 is a schematic overview of elements of a generated VHDL simulation model for the exemplary intermediate structures of FIGS. 17 and 18, in accordance with the present invention. FIG. 21 shows portions of a VHDL simulation model generated by TBT from a VIL model containing the fragments shown in FIG. 10 and FIG. 11. Lines 1–11 of FIG. 21 show VHDL code generated for the implementation times 1, t', and t_ack'. Lines 13–35 show code generated for the specification signals A, COUT_SUM, RST_OP, and LIVE_OR Lines 37–44 show code generated specific to the implementation signals a, rqtin, reset, sum, and cout. Finally, line 46 shows the component instantiation for the implementation model.

To generate code for the alias signals, TBT traverses the list of alias signal nodes stored in the intermediate structure. At each node of the list TBT generates a VHDL comment showing the alias signal name, and then it generates the VHDL component instantiations and behavioral statements suitable for each of the component nodes in the 'circuit' headed by the alias signal node. The choice of component or statement to be used is determined from the combination of component name, the mode of the component's f1 signal, the types of the component's signals, and the names of the component's signals.

For the most part, the VHDL components shown on lines 1–11 of FIG. 21 have a clear correspondence to the intermediate structure nodes of FIG. 17. The component names chgto1i, for-boundi, and fori correspond to the structure node names Changes_To, For_Bound, and For, respectively. The guardi component on lines 7–8 is generated from Alias component 1723 of FIG. 17. Its purpose is to indicate whether or not the time-defining event x_t_ckprime (for time t_ack') occurred within the current specification-level operation. The signal x_t_ackprimev maintains a count of the number of times the event occurs within the current operation. If the event has not occurred by the end of the operation, or has occurred more than once, then the test bench reports this error condition to the user. In the current embodiment this is implemented by having the file I/O process write this fact to the output file from information it receives on the x_t_ackprimev signal (see below). In other embodiments this fact could be reported as a VHDL assertion failure within the guardi component itself.

TBT generates code for the specification signals using the same approach used for the alias signals. The generated VHDL shown on lines 13–35 is of the same structural form as the corresponding intermediate structure nodes shown in FIG. 17 and FIG. 18. The VHDL generated for the implementation signals (lines 37–44) is likewise implemented by traversing the implementation signal node list and generating a type conversion operation for the Tbif component associated with each node. The implementation model instantiation on line 46 is generated in a standard way using the entity name obtained from the VIL model and the signal names obtained from the implementation signal node list.

The necessary VHDL component declaration, not shown in the figure, is generated in a similar fashion. The example shown in FIG. 21 is for an implementation test bench. For the other types of test benches capable of being generated by the invention, the specifics of the component declaration and instantiation are modified in the expected way known to those skilled in the relevant art. For example, self-testing test benches use both the specification and implementation models, while protocol test benches use neither.

Generating Input Selection and Output Recording/ Certification

The invention supports input selection and output recording/certification implemented: (i) by test bench-implemented processes and (ii) through the use of user-developed specification-level models.

Test Bench-Implemented Methods

FIG. 22 is a schematic overview of elements of a generated VHDL simulation model implementing input selection and output recording, in accordance with the present invention. The model is implemented as a VHDL process sensitive to the signal x0, which is the boundary event for specification process t. Repeating from above, the notion of a "specification process" is different from the notion of a VHDL process. Specification processes are finite-state machines describing a subset of the total behavior for a system, and are the result of behaviorally partitioning the specification into independent segments. An implementation implements the behavior of one or more specification-level processes.

Aside from the variable declarations which are not shown in FIG. 22, the VHDL process consists of three main sections: (i) read test mode, (ii) record output, and (iii) select input. Reading the test mode is done on the first rising edge of the boundary event (xcount is initially −1 and increments on the rising edge of the boundary event—it keeps the specification-level 'time' for specification process t). TBT currently supports three styles of input data selection: (i) vectors read from an input file, (ii) exhaustive selection implemented internal to the test bench, and (iii) random selection implemented internal to the test bench. The test mode reading is implemented on lines 4–12 of FIG. 22.

The two test bench input signals for specification process t (y_COUT_SUM and y_ACK_OP) are recorded into an output file on lines 14–24 of FIG. 21. The type conversion function OpTy2ch is used to convert the enumeration type values carried by y_ACK_OP into VHDL strings for file output. Conversion functions of this type are generated by TBT and stored into a separate package file, which are then read by the generated test benches (see below). On lines 20–23 of the figure, the test bench signal x_t_ackprimev is checked for its legal value of 1, which, as discussed above, indicates that the time-defining event x_t_ackprime occurred precisely once within the just-completed specification-level operation.

Output certification is implemented in a similar fashion, except that two test bench signals are compared within the VHDL process and the result of the comparison written to the output file.

The test bench output signals for specification process t are selected on lines 26–44 of FIG. 22. The vector mode of operation shown on lines 29–35, for signals y_A and y_RST_OP, reads values from an input file in an expected way. The type conversion function ch2OpTy converts the strings read from the file into the enumeration type values carried by y_RST_OP. In the exhaustive selection mode values are picked systematically by incrementing modulo-n counters associated with each of the output signals, where n corresponds to the number of legal values specified by the data type for each signal. In the random selection mode values are picked using a pseudo-random number generation function located in the rand package associated with TBT.

TBT generates the selection/recording process shown in FIG. 22 by executing a main process that makes calls to five sub-processes to implement: (i) declarations, (ii) signal recording, (iii) vector-based signal selection, (iv) exhaustive signal selection, and (v) random signal selection. The main process is executed once for each specification-level process contained in the VIL model such that each process uses its own input and output files, at simulation time, for its specification-level signals. To determine which specification-level signal belongs to which process, a 'process id' is stored into field i5 of each Abs component during the Build Intermediate Structure step of the Source Translator. A value of 0 is stored if the specification-level time is t, a value of 1 is stored for t0, 2 is stored for t1, and so on. During the generation of the VHDL processes to implement input selection and output recording/certification, only those specification signals with the correct value in i5 are used during each execution of the main process.

FIGS. 23–27 are VHDL component models implementing several VIL language constructs.

External Models

The invention supports the use of user-developed specification-level simulation models to implement input selection and output recording/certification. Implementing this requires a localized modification to the method just discussed. Rather than generating a VHDL process to implement input selection and output recording/certification, the revised method generates a component instantiation whose parameter actuals are signals used within the VHDL process. The component entity and architecture names (for VHDL) are provided by the user in this method, requiring a small modification to the VIL syntax shown in the figures of this description. One such modification would have a new 'interface' block contain an entity name and an architecture name, along with the signals associated with the interface.

TABLE 2

Type, Mode, and Name Settings for Implemented Test Bench Components

Abs Component

| Formula: | (i)   | F *= f |
|---|---|---|
|          | (ii)  | F(n) *= f |
|          | (iii) | F (n to m) *= f |
|          | (iv)  | F (m downto n) *= f |
| Component fields: | f1: | f |
|          | f2: | F |

TABLE 2-continued

Type, Mode, and Name Settings for Implemented Test Bench Components

```
                    f3:   n
                    f4:   m
                    i5:   process id
Types:       (i)    F: bit f: bit
             (ii)   F: bit_vector f: bit_vector
             (iii)  F: integer range f: integer range
             (iv)   F: enumeration type f: enumeration type
             (v)    F: array f: array
Modes:       (i)    F: in f: in
             (ii)   F: out f: out
Names:       F: "F" (the name "F" itself is used)
             f: "yF" ("y" is user-selectable specification name prefix)
```

Add Component/Sub Component

```
Formula:          x *= f + g / x *= f - g
Component fields:    f1:   x
                     f2:   f
                     f3:   g
Types:       x: integer f: integer g: integer
Modes:       (i)    x: in f: in g: in
             (ii)   x: out f: out g: out
Names:       x: "x#" (mode out) ("x" is user-selectable implementation name prefix, "#" is an integer)
             f: "x#" (mode out)
             (note: all "x#" assume name not otherwise defined)
             g: "x#" (mode out)
```

Advance Component/Delay Component

```
Formula:          x *= timewhen f -n / x *= timewhen f + n
Component fields:    f1:   x
                     f2:   f
                     f3:   n
Types:       x: dtime f: tb_logic n: integer
Modes:       x: in f: in n: constant
Names:       x: "x#" f: "x#" n: "n"
```

Alias Component

```
Formula:     (i)    alias F :type is f;
             (ii)   alias F :time is timewhen f;
             (iii)  alias F :time_vector(n to m) is timewhen f;
             (iv)   alias F :time_vector(m downto n) is timewhen f;
Component fields:    f1:   f
                     f1:   F
                     f3:   v (formula types ii, iii, iv) (used to indicate occurrence of time-defining event)
                     i5:   process id
Types        (i)    F: tb_logic f: tb_logic v: in
             (ii)   F: tb_logic_vector f: tb_logic_vector v: in
             (iii)  F: time f: time
             (iv)   F: time_vector f: time_vector
Modes:       (i)    F: in f: in
             (ii)   F: out f: out
Names:       F: "F" f: "x_f"
```

And Component/Or Component

```
Formula:     (i)    x *= f and g / x *= f or g
             (ii)   x *= f *and g / x *= f *or g
Component fields:    f1:   x
                     f2:   f
                     f3:   g
Types:       x: tb_logic f: tb_logic g: tb_logic
Modes:       (i)    x: in f: in g: in
             (ii)   x: out f: out g: out
Names:       f: "x#" (mode out) g: "x#" (mode out) x: "x#" (mode out)
```

At Component

```
Formula:     (i)    x *= f at timewhen e
             (ii)   x *= f at timewhen e(n) (see Element component)
             (iii)  x *= f at timewhen e(n to m) (see Slice_Up component)
             (iv)   x *= f at timewhen e(m downto n) (see Slice_Down component)
Component fields:    f1:   x
                     f2:   f
                     f3:   e
Types:       (i)    x: tb_logic f: tb_logic e: tb_logic
             (ii)   x: tb_logic_vector f: tb_logic_vector e: tb_logic
             (iii)  x: tb_logic_vector f: tb_logic e: tb_logic_vector
             (iv)   x: array f: tb_logic_vector e: tb_logic_vector
Modes:       (i)    x: in f: in e: in (i) or none (ii, iii, iv)
             (ii)   x: out f: out e: in (i) or none (ii, iii, iv)
```

TABLE 2-continued

Type, Mode, and Name Settings for Implemented Test Bench Components

Names:      f: "x#" e: "x#" (i only) x: "x#"
Cat Components

Formula:    x *= f & g
Component fields:   f1:  x
                    f2:  f
                    f3:  g
Types:      (i)     x: tb_logic_vector f: tb_logic or tb_logic_vector g: tb_logic or tb_logic_vector
            (ii)    x: array f: array g: tb_logic_vector or array
            (iii)   x: array f: tb_logic_vector or array g: array
Modes:      (i)     x: in f: in g: in
            (ii)    x: out f: out g: out
Names:      f: "x#" (mode out) g: "x#" (mode out) c: "x#" (mode out)
Changes_To Components/Changes_To_Not Components Formula:    x *= f -> c
Component fields:   f1:  x
                    f2:  f
                    f3:  c
Types       (i)     x tb_logic f: tb_logic c: tb_logic
            (ii)    x tb_logic f: tb_logic_vector c: tb_logic_vector
Modes:      (i)     x in f in c in or constant
            (ii)    x: out f: out c: in or constant
Names:      f: "x#" c: "c" x: "x#"
Cond Components Formula:    x *= c *when f *else
Component fields:   f1:  x
                    f2:  f
                    f3:  c
Types:      (i)     x: bit f: tb_logic c: bit
            (ii)    x: bit_vector f: tb_logic c: bit_vector
            (iii)   x: integer range f: tb_logic c: integer range
            (iv)    x: enumeration type f: tb_logic c: enumeration type
Modes:      (i)     x: in f: in c: in or constant
            (ii)    x: out f: out c: in or constant
Names:      f: "x#" (mode Out)
            c: "x#" (for bits and bit_vectors)
            c: "c" (for integer ranges and enumeration types)
CountOf Components Formula:    x *= countof f in { timewhen e1, timewhen e2 }
Component fields:   f1:  x
                    f2:  f
                    f3:  ele2 (see Leftright component)
Types:      x: integer f: tb_logic ele2: no_type
Modes:      (i)     x: in f: in ele2: in
            (ii)    x: out f: out ele2: in
Names:      f: "x#" x: "x#"
During Components Formula:    x *= f during { timewhen e1, timewhen e2 }
Component fields:   f1:  x
                    f2:  f
                    f3:  ele2 (see Leftright component)
Types:      x: tb_logic f: tb_logic ele2: no_type
Modes:      (i)     x: in f: in ele2: in
            (ii)    x: out f: out ele2: in
Names:      f: "x#" x: "x#"
Element Components Formula:    x *= f (n)
Component fields:   f1:  x
                    f2:  f
                    f3:  n
Types:      (i)     x: tb_logic f: tb_logic_vector n: integer
            (ii)    x: dtime f: dtime_vector n: integer
Modes:      (i)     x: in f: in n: in or constant
            (ii)    x: out f: out n: in or constant
Names:      f: "x#" n: "n" (for mode constant), "x#" (for mode in) x: "x#" (for mode out)
Eq Components/Eq_Not Components Formula:    (i)     x *= f *= g / x *= f */= g
            (ii)    x *= f *= g / x *= f */= g
Component fields:   f1:  x
                    f2:  f
                    f3:  g

TABLE 2-continued

Type, Mode, and Name Settings for Implemented Test Bench Components

| | |
|---|---|
| Types: | x: tb_logic f: tb_logic g: tb_logic |
| Modes: | x: in f: in g: in |
| | x: out f: out g: out |
| Names: | f: "x#" (for mode out) g: "x#" (for mode out) x: "x#" (for mode out) |

For Components

| | | |
|---|---|---|
| Formula: | (i) | x *= f for n 'thcountsince timewhen e |
| | (ii) | x *= f for (n to m) 'thcountsince timewhen e |
| | (iii) | x *= f for (m downto n) 'thcountsince timewhen e |
| Component fields: | f1: | x |
| | f2: | f |
| | f3: | e |
| | f4: | fin (for mode out) |
| | f5: | mn |
| Types: | (i) | x: tb_logic f: tb_logic e: tb_logic fin: tb_logic mn: integer (i), no_type (ii, iii) |
| Modes: | (i) | x: in f: in e: in mn: in or constant |
| | (ii) | x: out f: out e: in mn: in or constant |
| Names: | f: "x#" e: "x#" fin: "x#" (for mode Out) x: "x#" |

For_Arb Components

| | | |
|---|---|---|
| Formula: | x *= f for arb 'thcountsince timewhen e | |
| Component fields: | f1: | x |
| | f2: | f |
| | f3: | e |
| | f4: | fin (for mode out) |
| Types: | x: tb_logic f: tb_logic e: tb_logic fin: tb_logic | |
| Modes: | (i) | x: in f: in e: in |
| | (ii) | x: out f: out e: in fin: in |
| Names: | f: "x#" e: "x#" fin: "x#" (mode out) x: "x#" | |

For_Bound Components

| | | |
|---|---|---|
| Formula: | x *= f for t 'thcountsince timewhen e | |
| Component fields: | f1: | x |
| | f2: | f |
| | f3: | e |
| | f4: | fin (for mode out) |
| | f5: | cnt |
| Types: | x: tb_logic f: tb_logic e: tb_logic fin: tb_logic cnt: integer | |
| Modes: | (i) | x: in f: in e: in cnt: in |
| | (ii) | x: out f: out e: in fin: in cnt: in |
| Names: | f: "x#" e: "x#" fin: "x#" (mode out) cnt: "xcount" x: "x#" | |

Func Components

| | | |
|---|---|---|
| Formula: | x *= f (g) | |
| Component fields: | f1: | x |
| | f2: | g |
| | f3: | f |
| Types: | x: bit g: tb_logic f: tb_logic->bit | |
| | x: bit_vector g: tb_logic_vector f: tb_logic_vector->bit_vector | |
| | x: integer g: tb_logic f: tb_logic->integer | |
| | x: integer g: tb_logic_vector f: tb_logic_vector->integer | |
| Modes: | x: in g: in f: constant | |
| | x: out g: out f: constant | |
| Names: | g: "x#" x: "x#" | |

Implies Components

| | | |
|---|---|---|
| Formula: | (i) | x *= f implies g |
| | (ii) | x *= f *implies g |
| Component fields: | f1: | x |
| | f2: | f |
| | f3: | g |
| Types: | x: tb_logic f: tb_logic g: tb_logic | |
| Modes: | (i) | x: in f: in g: in |
| | (ii) | x: out f: in g: out |
| Names: | g: "x#" x: "x#" | |

Is Components/Is_Not Componentes

| | | |
|---|---|---|
| Formula: | x *= f = c / x *= f /= c | |
| Component fields: | f1: | x |
| | f2: | f |
| | f3: | c |
| Types: | (i) | x: tb_logic f: tb_logic c: tb_logic |
| | (ii) | x: tb_logic f: tb_logic_vector c: tb_logic_vector |
| Modes: | (i) | x: in f: in c: in or constant |
| | (ii) | x: out f: out c: in or constant |
| Names: | f: "x#" (mode out) c: "c" x: "x#" (mode out) | |

TABLE 2-continued

Type, Mode, and Name Settings for Implemented Test Bench Components

Leftright Components

Formula: x *= { timewhen e1 , timewhen e2 }
Component fields:  f1: x
                   f2: e1
                   f3: e2
                   i5: interval id (e.g. CLOSED_CLOSED, CLOSED_OPEN, etc.)
Types:    x: no_type e1: tb_logic e2: tb_logic i5: intervalType
Modes:    x: in e1: in e2: in
Names:    e1: "x#" e2: "x#"

Not Components

Formula: x *= not f
Component fields:  f1: x
                   f3: f
Types:    x: tb_logic f: tb_logic
Modes:    x: in f: in
          x: out f: out
Names:    f: "x#" (out) x: "x#" (out)

Slice_Down Components

Formula: x *= f (m downto n)
Component fields:  f1: x
                   f2: f
                   f3: n
                   f4: m
                   i5: −1
Types:    (i)   x: tb_logic_vector f: tb_logic_vector n: integer m: integer
          (ii)  x: dtime_vector f: dtime_vector n: integer m: integer
Modes:    (i)   x: in f: in n: in or constant m; in or constant
          (ii)  x: out f: out n: in or constant m: in or constant
Names:    f: "x#" n: "x#" (mode in), "n" (mode constant) m: "x#" (mode in), "n"(mode constant)
          x: "x#" (mode out)

Slice_Up Components

Formula: x *= f (n to m)
Component fields:  f1: x
                   f2: f
                   f3: n
                   f4: m
                   i5: 1o ut
Types:    (i)   x: tb_logic_vector f: tb_logic_vector n: integer m: integer
          (ii)  x: dtime_vector f: dtime_vector n: integer m: integer
Modes:    (i)   x: in f: in n: in or constant m: in or constant
          (ii)  x: out f: out n: in or constant m: in or constant
Names:    f: "x#" n: "x#" (mode in), "n" (mode constant) m: "x#" (mode in), "n" (mode constant)
          x: "x#" (mode out)

Stable_During Components

Formula: x *= f stable during { timewhen e1 , timewhen e2 }
Component fields:  f1: x
                   f2: f
                   f3: ele2 (see Leftright component)
                   f4: fin (for mode out)
Types:    x: tb_logic f: tb_logic ele2: no_type
          x: tb_logic f: tb_logic_vector ele2: no_type
Modes:    x: in f: in ele2: in
          x: out f: out ele2: in fin: in
Names:    f: "x#" x: "x#" fin: "x#" (mode out)

Tbif Components

Component fields:  f1: x (internal version of declared implementation signal)
                   f2: f (declared implementation signal)
                   i5: n (number of instances of x in test bench)
Types:    x: tb_logic f: tb_logic n: integer
          x: tb_logic_vector f: tb_logic_vector n: integer
Modes:    x: in f: in
          x: in or out f: out
Names:    f: "i" x: "x_f"

Updown Components

Formula: x *= (n to m)
         x *= (m downto n)
Component fields:  f1: x
                   f2: n
                   f3: m
                   i5: slope (+1 for up, −1 for down)

TABLE 2-continued

Type, Mode, and Name Settings for Implemented Test Bench Components

Types:  x: no_Type n: integer m: integer slope: integer
Modes:  x: in n: in or constant m: in or constant
Names:  n: "x#" (mode in), "n" (mode constant) m: "x#" (mode in), "n" (mode constant)
Within Components Formula:  x *= f within { timewhen e1 , timewhen e2 }
Component fields:  f1:  x
                   f2:  f
                   f3:  ele2 (see Leftright component)
                   f4:  fin (for mode out)
Types:  x: tb_logic f: tb_logic ele2: no_type
        x: tb_logic f: tb_logic_vector ele2: no_type
Modes:  x: in f: in ele2: in
        x: out f: out ele2: in fin: in
Names:  f: _x: "x#" fin: "x#" (mode out)

References

[Arm] J. R. Armstrong, et. al., "High Level Generation of VHDL Test Benches," in *VHDL International Users' Forum*, April 1995.

[Bor] G. Borriello, *A New Interface Specification Methodology and its Application to Transducer Synthesis*, Ph.D. Thesis, Computer Science Division (EECS), University of California, Berkeley, May 1988.

[ED1] "ESDA Software Adds Enhancements and Links to Verilog Testbench Tool," *Electronic Design*, Jun. 12, 1995.

[ED2] "Automatically Generate VHDL and Verilog Testbench Models from Digital Timing Diagrams," *Electronic Design*, Oct. 13, 1995.

[EE1] "Swiss Tool Maker Looks to Fill Top-Down-Design Void," *Electronic Engineering Times*, Jun. 19, 1995.

[EE2] "Synopsys VSS Automates Regression Testing," *Electronic Engineering Times*, Sep. 11, 1995.

[EE3] "Vera Talks Verification," *Electronic Engineering Times*, Sep. 25, 1995.

[EE4] "Timing Diagram Editor Displays Waveforms," *Electronic Engineering Times*, Oct. 9, 1995.

[Fu1] D. A. Fura, P. J. Windley, and A. K. Somani, "Abstraction Techniques for Modeling Real-World Interface Chips," in J. Joyce and C. Seger (eds.), *Higher-Order Logic Theorem Proving and its Applications*, Springer-Verlag, 1993.

[Fu2] D. A. Fura and A. K. Somani, "Interpreter Abstraction Languages: From their Formal Semantics to their Role in Better Simulation Practices," Participants' Proceedings, *Higher-Order Logic Theorem Proving and its Applications*, 1994.

[Fu3] D. A. Fura and A. K. Somani, "Transaction-Level Specification of VHDL Design Models," *VHDL International Users' Forum*, October 1995.

[Fu4] D. A. Fura and A. K. Somani, "Abstraction-Directed Synthesis of VHDL Test Benches," *VHDL International Users' Forum*, February–March 1996.

[Fu5] D. A. Fura, *Abstract Interpreter Modeling and Verification Methods for Dependable Embedded Hardware Systems*, Ph.D. Thesis, Electrical Engineering Department, University of Washington, Seattle, March 1995.

[Gor] M. Gordon, "Why Higher-Order Logic is a Good Formalism for Specifying and Verifying Hardware," in G. J. Milne and P. A. Subrahmanyam (eds.), *Formal Aspects of VHDL Design*, Elseview Science Publishers, 1986.

[IEE] Institute of Electrical and Electronics Engineers, Inc., *IEEE Standard VHDL Language Reference Manual*, 1993.

[Me1] T. F. Melham, "Abstraction Mechanisms for Hardware Verification," in G. Birtwistle and P. A Subrahmanyam (eds.), *VLSI Specification, Verification, and Synthesis*, Kluwer Academic Publishers, 1988.

I claim:

1. A method for generating simulation model segments relating to an electronic circuit having one or more input signals, the method comprising the steps of:
   a) providing an abstraction model for the electronic circuit, the abstraction model including:
      i. definitions for one or more implementation-level signals representing the circuit interface, the implementation-level signals being characterized by a name, a type, and a directionality,
      ii. definitions for one or more specification-level signals, the specification-level signals being expressed at a higher level of temporal or data abstraction than the implementation-level signals, the specification-level signals further being characterized by a name, a type, and a directionality, and
      iii. a definition of the relationship between one or more implementation-level signals and one or more specification-level signals; and
   b) analyzing the abstraction model and producing simulation model segments therefrom, the simulation model segments implementing signal relationships of the abstraction model, the signal relationships mapping one or more specification-level signals into one or more implementation-level signals or mapping one or more implementation-level signals into one or more specification-level signals.

2. The method of claim 1, wherein the simulation model segments implementing the abstraction model are part of a simulation test bench model exercising a simulation model of the electronic circuit, further including the steps of:
   c) obtaining values for one or more specification-level signals, the specification-level signals being defined in the abstraction model;
   d) converting the specification-level signal values of c) into values for one or more implementation-level signals, the implementation-level signals being defined in the abstraction model, the conversion of specification-level values into implementation-level values implementing the relationships defined in the abstraction model; and
   e) driving the converted specification-level signal values to the input ports of the simulation model of the circuit.

3. The method of claim 2, wherein the test bench model tests the simulation model of the circuit against a specification model of the circuit, the specification-level interface signals of the specification model being defined in the abstraction model by the step of:

f) driving the specification-level signal values to the input ports of the specification model.

4. The method of claim 2, wherein the test bench model obtains values for one or more specification-level signals by instantiating a simulation component model that produces specification-level values.

5. The method of claim 2, wherein the test bench model obtains values for one or more specification-level signals by implementing an algorithm to generate the values, the algorithm generating values either deterministically or in a pseudo-random fashion.

6. The method of claim 1, wherein the simulation model segments implementing the abstraction model are part of a simulation test bench model exercising a simulation model of the electronic circuit, further including the steps of:

c) reading values for one or more implementation-level signals that are produced by the simulation model of the circuit, the implementation-level signals being defined in the abstraction model; and d) converting the signal values that are read in step c) into values for one or more specification-level signals, the specification-level signals being defined in the abstraction model, the conversion of implementation-level values into specification-level values implementing the relationships defined in the abstraction model.

7. The method of claim 6, wherein the test bench model tests the simulation model of the circuit against a specification model of the circuit, the specification-level interface signals of the specification model being defined in the abstraction model by the step of:

e) comparing the converted specification-level signals against the signal values that are produced by the specification model, the comparison of each pair of values determining whether the values are the same or different.

8. The method of claim 1, wherein the simulation model segments implementing the abstraction model are part of a bit-true representation model, the bit-true representation model having one or more implementation-level input signals, one or more implementation-level output signals, and one or more internal functional units operating over one or more specification-level signals, further including the steps of:

c) reading values for one or more implementation-level input signals;

d) converting the signal values read in step c) into values for one or more specification-level signals, the conversion of implementation-level values into specification-level values implementing the relationships defined in the abstraction model;

e) driving the specification-level values from step d) to one or more internal functional units;

f) reading the signal values output by the internal functional units; and g) converting the signal values read in step f) into values for one or more implementation-level output signals, the conversion of specification-level values into implementation-level values implementing the relationships defined in the abstraction model.

9. The method of claim 1, wherein the simulation model segments implementing the abstraction model are part of a circuit implementation model synthesized for possible subsequent compilation into a silicon implementation, the circuit implementation model containing one or more implementation-level interface signals and one or more internal functional units, the functional units operating over one or more specification-level signals expressed at a higher level of temporal abstraction than the implementation-level signals but at the same level of data abstraction as the implementation-level signals, further including the steps of:

c) reading values for one or more implementation-level signals, the implementation-level signals being driven by other subsystems within the circuit implementation model or obtained from the circuit implementation model input ports;

d) converting the signal values that were read in step c) into values for one or more specification-level signals, the conversion of implementation-level values into specification-level values implementing the relationships being defined in the abstraction model;

e) driving the converted signal values of step d) to one or more internal functional units; and f) reading the signal values that are produced by the internal functional units for distribution to other subsystems within the circuit implementation model or to the circuit implementation model output ports.

10. The method of claim 9, wherein the temporal abstraction conversion is achieved by sampling the signal values at times defined within the abstraction model, and by holding the values unchanged at all other times.

11. A system for generating simulation model segments relating to an electronic circuit having one or more input signals, the system comprising:

means for providing an abstraction model for the electronic circuit, the abstraction model including:

i. definitions for one or more implementation-level signals representing the circuit interface, the implementation-level signals being characterized by a name, a type, and a directionality, ii. definitions for one or more specification-level signals, the specification-level signals being expressed at a higher level of temporal or data abstraction than the implementation-level signals, the specification-level signals further being characterized by a name, a type, and a directionality, and iii. a definition of the relationship between one or more implementation-level signals and one or more specification-level signals; and means for analyzing the abstraction model and producing simulation model segments therefrom, the simulation model segments implementing signal relationships of the abstraction model, the signal relationships mapping one or more specification-level signals into one or more implementation-level signals or mapping one or more implementation-level signals into one or more specification-level signals.

12. The system of claim 11, wherein the simulation model segments implementing the abstraction model are part of a simulation test bench model exercising a simulation model of the circuit, further including:

means for obtaining values for one or more specification-level signals, the specification-level signals being defined in the abstraction model;

means for converting the specification-level signal values into values for one or more implementation-level signals, the implementation-level signals being defined in the abstraction model, the conversion of specification-level values into implementation-level values implementing the relationships defined in the abstraction model; and means for driving the converted specification-level signal values to the input ports of the simulation model of the circuit.

13. The system of claim 12, wherein the test bench model tests the simulation model of the circuit against a specification model of the circuit, including:
   means for driving the specification-level signal values to the input ports of the specification model.

14. The system of claim 12, wherein the test bench model obtains values for one or more specification-level signals by instantiating a simulation component model that produces specification-level values.

15. The system of claim 12, wherein the test bench model obtains values for one or more specification-level signals by implementing an algorithm to generate the values, the algorithm generating values either deterministically or in a pseudo-random fashion.

16. The system of claim 11, wherein the simulation model segments implementing the abstraction model are part of a simulation test bench model exercising a simulation model of the electronic circuit, further including:
   means for reading values for one or more implementation-level signals that are produced by the simulation model of the circuit, the implementation-level signals being defined in the abstraction model; and
   means for converting the signal values read by the means for reading values into values for one or more specification-level signals, the specification-level signals being defined in the abstraction model, the conversion of implementation-level values into specification-level values implementing the relationships defined in the abstraction model.

17. The system of claim 16, wherein the test bench model tests the simulation model of the circuit against a specification model of the circuit, further including:
   means for comparing the converted specification-level signals against the signal values that are produced by the specification model, the comparison of each pair of values determining whether the values are the same or different.

18. The system of claim 11, wherein the simulation model segments implementing the abstraction model are part of a bit-true representation model, the bit-true representation model having one or more implementation-level input signals, one or more implementation-level output signals, and one or more internal functional units operating over one or more specification-level signals, further including:
   means for reading values for one or more implementation-level input signals;
   means for converting the signal values read by the means for reading values into values for one or more specification-level signals, the conversion of implementation-level values into specification-level values implementing the relationships defined in the abstraction model;
   means for driving the specification-level values produced by the means for converting the signal values to one or more internal functional units;
   means for reading the signal values driven by the internal functional units; and
   means for converting the signal values read by the means for reading the signal values into values for one or more implementation-level output signals, the conversion of specification-level values into implementation-level values implementing the relationships defined in the abstraction model.

19. The system of claim 11, wherein the simulation model segments implementing the abstraction model are part of a circuit implementation model synthesized for subsequent compilation into a silicon implementation, the circuit implementation model containing one or more implementation-level interface signals and one or more internal functional units, the functional units operating over one or more specification-level signals expressed at a higher level of temporal abstraction than the implementation-level signals but at the same level of data abstraction as the implementation-level signals, further including:
   means for reading values for one or more implementation-level signals, the implementation-level signals being driven by other subsystems within the circuit implementation model or obtained from the circuit implementation model input ports;
   means for converting the signal values read by the means for reading values into values for one or more specification-level signals, the conversion of implementation-level values into specification-level values implementing the relationships defined in the abstraction model;
   means for driving the values for one or more specification-level signals to one or more internal functional units; and
   means for reading the signal values output by the internal functional units for distribution to other subsystems within the circuit implementation model or to the circuit implementation model output ports.

20. The system of claim 19, wherein the temporal abstraction conversion is achieved by means for sampling the signal values at times defined within the abstraction model, and by holding the values unchanged at all other times.

* * * * *